(12) United States Patent
Kawai et al.

(10) Patent No.: US 11,711,929 B2
(45) Date of Patent: Jul. 25, 2023

(54) FIELD-EFFECT TRANSISTOR, METHOD FOR MANUFACTURING SAME, AND WIRELESS COMMUNICATION DEVICE

(71) Applicant: Toray Industries, Inc., Tokyo (JP)

(72) Inventors: Shota Kawai, Otsu (JP); Hiroji Shimizu, Otsu (JP); Seiichiro Murase, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 193 days.

(21) Appl. No.: 17/428,665

(22) PCT Filed: Feb. 13, 2020

(86) PCT No.: PCT/JP2020/005522
§ 371 (c)(1),
(2) Date: Aug. 5, 2021

(87) PCT Pub. No.: WO2020/170925
PCT Pub. Date: Aug. 27, 2020

(65) Prior Publication Data
US 2022/0131097 A1      Apr. 28, 2022

(30) Foreign Application Priority Data

Feb. 21, 2019   (JP) ................................. 2019-029188

(51) Int. Cl.
*H01L 23/00* (2006.01)
*H10K 10/84* (2023.01)
(Continued)

(52) U.S. Cl.
CPC ........... *H10K 10/84* (2023.02); *H10K 10/466* (2023.02); *H10K 10/484* (2023.02); *H10K 71/621* (2023.02); *H10K 85/221* (2023.02)

(58) Field of Classification Search
CPC .............................. H10K 10/84; H10K 10/466
See application file for complete search history.

(56) References Cited

U.S. PATENT DOCUMENTS

| 7,575,952 B2 | 8/2009 | Arai et al. |
| 9,715,145 B2 | 7/2017 | Matsukizono |
| (Continued) | | |

FOREIGN PATENT DOCUMENTS

| JP | 6012770 A | 1/1985 |
| JP | 2007129007 A | 5/2007 |
| (Continued) | | |

OTHER PUBLICATIONS

Grubb, P.M., et al., "X-Band Printed Phased Array Antennas using High-Performance CNT/Ion Gel/AG Transistors", Proceedings of SPIE, May 9, 2016, vol. 9738, pp. 973813-1-973813-12, ISBN: 978-1-5108-1533.5.

(Continued)

*Primary Examiner* — Anthony Ho
(74) *Attorney, Agent, or Firm* — RatnerPrestia

(57) ABSTRACT

A field-effect transistor comprises, on a substrate, a source electrode, a drain electrode, and a gate electrode; a semiconductor layer in contact with the source electrode and the drain electrode; wires individually electrically connected to the source electrode and the drain electrode; and a gate insulating layer that insulates the semiconductor layer from the gate electrode, wherein a connecting portion between the source electrode and the wire forms a continuous phase, and a connecting portion between the drain electrode and the wire forms a continuous phase, the portions constituting the continuous phases contain at least an electrically conductive component and an organic component, and integrated values of optical reflectance at a region of a wavelength of 600 nm or more and 900 nm or less on the wires are higher than integrated values of optical reflectance at a region of a wavelength of 600 nm or more and 900 nm or less on the source electrode and the drain electrode.

12 Claims, 6 Drawing Sheets

(51) Int. Cl.
  *H10K 10/46*  (2023.01)
  *H10K 71/00*  (2023.01)
  *H10K 85/20*  (2023.01)

(56)  References Cited

U.S. PATENT DOCUMENTS

| | | |
|---|---|---|
| 2018/0210337 A1 | 7/2018 | Wakita et al. |
| 2019/0198786 A1 | 6/2019 | Shimizu et al. |

FOREIGN PATENT DOCUMENTS

| | | |
|---|---|---|
| JP | 2009152335 A | 7/2009 |
| JP | 2009218295 A | 9/2009 |
| JP | 2010267752 A | 11/2010 |
| KR | 20180115539 A | 10/2018 |
| WO | 2012090794 A1 | 7/2012 |
| WO | 2015046204 A1 | 4/2015 |
| WO | 2017030070 A1 | 2/2017 |
| WO | 2018051860 A1 | 3/2018 |

OTHER PUBLICATIONS

Extended European Search Report for European Application No. 20759669.3, dated Oct. 27, 2022, 7 pages.
International Search Report and Written Opinion for International Application No. PCT/JP2020/005522, dated Apr. 14, 2020, 5 pages.

(a)

(b)

(c)

(d)

FIELD-EFFECT TRANSISTOR, METHOD FOR MANUFACTURING SAME, AND WIRELESS COMMUNICATION DEVICE

CROSS REFERENCE TO RELATED APPLICATIONS

This is the U.S. National Phase application of PCT/JP2020/005522, filed Feb. 13, 2020, which claims priority to Japanese Patent Application No. 2019-029188, filed Feb. 21, 2019, the disclosures of each of these applications being incorporated herein by reference in their entireties for all purposes.

FIELD OF THE INVENTION

The present invention relates to a field-effect transistor, a method for manufacturing the same, and a wireless communication device including the same.

BACKGROUND OF THE INVENTION

In recent years, a wireless communication system using a radio frequency identification (RFID) technology has attracted attention. RFID tags include an IC chip having a circuit composed of a field-effect transistor (hereinafter, referred to as an FET), and an antenna for wireless communication with a reader/writer. The antenna installed in the tag receives a carrier wave transmitted from the reader/writer, and a drive circuit in the IC chip operates.

The RFID tags are expected to be used in various applications such as distribution management, product management and shoplifting prevention, and have been partially introduced in IC cards such as traffic cards, product tags and the like.

In order to use the RFID tags in any kind of products in the future, it is necessary to reduce manufacturing costs. Accordingly, there has been proposed a method for manufacturing a circuit or an antenna on a flexible substrate by using a coating/printing technique in place of a manufacturing process using vacuum or high temperature (See, for example, Patent Document 1.).

In the FET composing the circuit in the RFID, defective formation of a wire is allowed as long as it is within a range in which sufficient electrical conductivity is obtained, but defective formation of a source/drain electrode causes decrease in operation speed, deterioration of the FET performance, and variation. In particular, in a flexible substrate, defective formation of a source/drain electrode is likely to occur due to the influence of substrate distortion. Accordingly, there has been proposed a method for performing highly accurate alignment by performing exposure from the back surface side of a substrate using a gate electrode as a light shielding mask at the time of patterning source/drain electrodes. (See, for example, Patent Document 2).

PATENT DOCUMENTS

Patent Document 1: WO 2017/030070 A
Patent Document 2: WO 2018/051860 A

SUMMARY OF THE INVENTION

Whether or not defective formation occurs in source/drain electrodes and wires is confirmed in an inspection step after formation of them. However, in the method described in Patent Document 2, there is a problem that it is not possible to distinguish defective formation of source/drain electrodes from defective formation of wires in the inspection step as follows.

In the method for manufacturing a transistor described in Patent Document 2, source/drain electrodes are formed by exposing an electrically conductive film on a gate insulating layer from the back surface side of a substrate using a gate electrode as a light shielding mask, and further developing the electrically conductive film. This method is excellent in that source/drain electrodes can be formed with high positional accuracy without requiring alignment of a mask. However, in order to collectively form not only source/drain electrodes but also wires connected thereto, the following method is required. An electrically conductive film is provided in advance so as to cover the entire region where electrodes and wires are to be formed, and then, separately using a mask covering the wire forming portion, back surface exposure is performed. In this case, alignment of the mask is required. In addition, since the resulting wires and electrodes have been both exposed and developed under the same conditions, the appearance observed in the inspection step is so similar to each other that both cannot be distinguished.

The present invention focuses on the above problems, and has an object to provide an FET in which electrodes and wires are easily and satisfactorily distinguished in image inspection.

In order to solve the above problems, a field-effect transistor according to embodiments of the present invention is a field-effect transistor including, on a substrate, a source electrode, a drain electrode, and a gate electrode;
a semiconductor layer in contact with the source electrode and the drain electrode;
wires individually electrically connected to the source electrode and the drain electrode; and
a gate insulating layer that insulates the semiconductor layer from the gate electrode,
in which the source electrode, the drain electrode and the wires are in a continuous phase,
the continuous phase contains at least an electrically conductive component and an organic component, and
integrated values of optical reflectance at a region of a wavelength of 600 nm or more and 900 nm or less on the wires are higher than integrated values of optical reflectance at a region of a wavelength of 600 nm or more and 900 nm or less on the source electrode and the drain electrode.

According to the present invention, it is possible to provide a field-effect transistor that can be manufactured at low cost using a simple process and that facilitates distinction between wires and source/drain electrodes during inspection.

DETAILED DESCRIPTION OF EMBODIMENTS OF THE INVENTION

Hereinafter, a detailed description is made of suitable embodiments of a field-effect transistor (FET) and a method for manufacturing the same according to the present invention with appropriate reference to the drawings. Note that the present invention is not limited by these embodiments, but various modifications can be made as long as the object of the present invention can be achieved without departing from the gist of the present invention.

<Field-Effect Transistor>

A field-effect transistor (FET) according to an embodiment of the present invention includes, on a substrate, a source electrode, a drain electrode, and a gate electrode; a semiconductor layer in contact with the source electrode and the drain electrode; wires individually electrically connected to the source electrode and the drain electrode; and a gate insulating layer that insulates the semiconductor layer from the gate electrode, in which a connecting portion between the source electrode and the wire forms a continuous phase, and a connecting portion between the drain electrode and the wire forms a continuous phase, the portions constituting the continuous phases contain at least an electrically conductive component and an organic component, and integrated values of optical reflectance at a region of a wavelength of 600 nm or more and 900 nm or less on the wires are higher than integrated values of optical reflectance at a region of a wavelength of 600 nm or more and 900 nm or less on the source electrode and the drain electrode.

Figure 1:
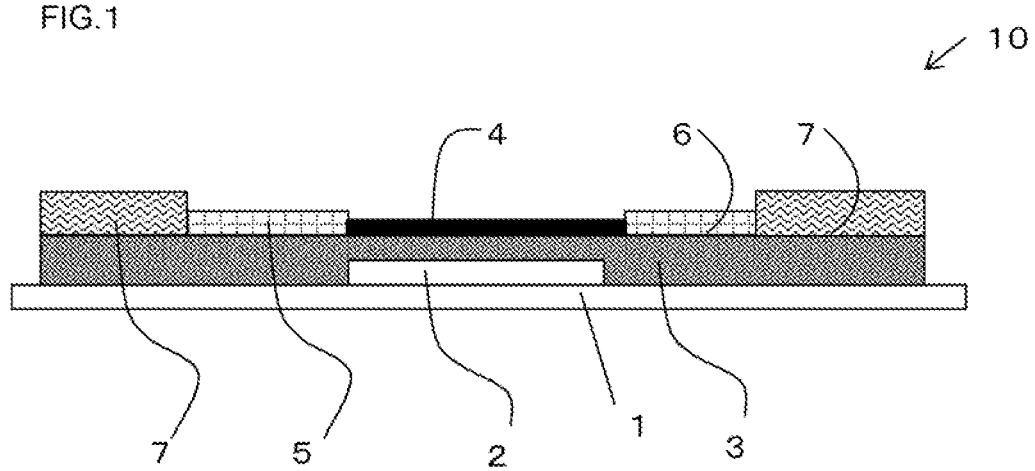
FIG. 1 is a schematic cross-sectional view illustrating a field-effect transistor according to an embodiment 1 of the present invention.

FIG. 1 is a schematic cross-sectional view illustrating a configuration of an FET according to an embodiment 1 of the present invention. An FET 10 according to the embodiment 1 includes a gate electrode 2 formed on a substrate 1, a gate insulating layer 3 covering the gate electrode 2, a source electrode 5 and a drain electrode 6 provided on the gate insulating layer 3, wires 7 electrically connected to the electrodes, and a semiconductor layer 4 provided between the electrodes.

Figure 2:
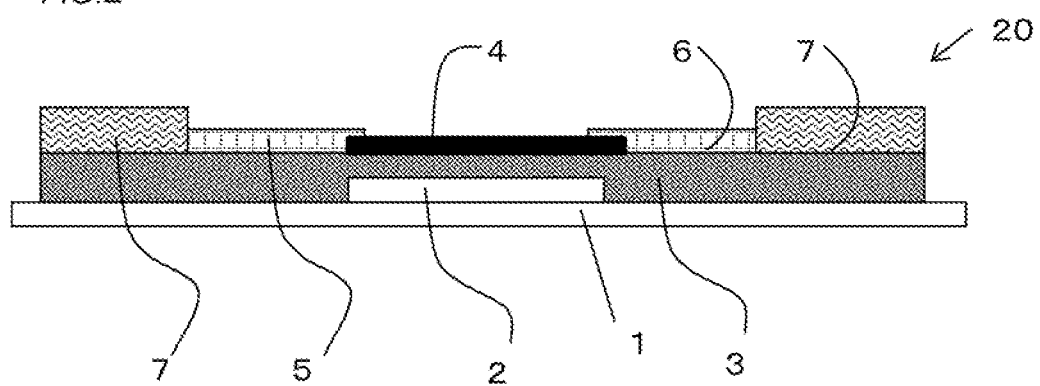
FIG. 2 is a schematic cross-sectional view illustrating a field-effect transistor according to an embodiment 2 of the present invention.

FIG. 2 is a schematic cross-sectional view illustrating a configuration of an FET according to an embodiment 2 of the present invention. An FET 20 according to the embodiment 2 includes a gate electrode 2 formed on a substrate 1, a gate insulating layer 3 covering the gate electrode 2, a source electrode 5 and a drain electrode 6 provided on the gate insulating layer 3, wires 7 electrically connected to the electrodes, and a semiconductor layer 4 provided between the electrodes. In this embodiment, the source electrode 5 and the drain electrode 6 are provided so as to partially cover the semiconductor layer 4.

Each of the configurations according to the embodiment 1 and the embodiment 2 is a so-called bottom gate top contact structure in which a gate electrode is disposed under a semiconductor layer, and a source electrode and a drain electrode are disposed over the upper surface of the semiconductor layer.

Embodiments of the FET according to the present invention are not limited to them. In addition, the following description is common regardless of embodiments unless otherwise specified.

(Substrate)

The material used for the substrate is not particularly limited, but is preferably one in which at least the surface on which the electrode is disposed is insulating. In addition, a material that transmits light used for exposure by 50% or more is preferable, and a material that transmits light by 80% or more is more preferable.

For example, a substrate is suitably used including, without limitation:

an inorganic material such as glass, sapphire, alumina sintered body, silicon wafer, or those whose surfaces are coated with an oxide film; or a resin such as a polyimide (PI) resin, a polyester resin, a polyamide resin, an epoxy resin, a polyamideimide resin, a polyetherimide resin, a polyetherketone resin, a polysulfone resin, a polyphenylene sulfide (PPS) resin, or a cycloolefin resin.

Among them, it is preferable to contain at least one resin selected from polyethylene terephthalate (PET), polyethylene naphthalate, PPS, polyphenylene sulfone, a cycloolefin polymer, polyamide or PI, and a PET film is preferable from the viewpoint of low price.

In addition, from the viewpoint of adhesion between the substrate and the gate electrode or the wires, a polysulfone resin substrate or a PPS resin substrate is also preferable. This is presumed to be because metal atoms in the lower electrode and the wires strongly interact with sulfur atoms contained in these resins.

In addition, the thickness of the substrate is preferably 200 µm or less. Within this range, during processing of the electrically conductive film by exposure from the back surface of the substrate, scattering of exposure light in the substrate is suppressed so that the processing accuracy of the electrically conductive film is further improved.

In the present invention, a primer layer may be formed on the substrate. As a result, flatness of the substrate can be improved, and adhesion of the lower electrode can be improved.

The material used for the primer layer is not particularly limited, but specific examples thereof include an acrylic resin, an epoxy resin, a novolak resin, a phenol resin, a polyimide precursor resin, a polyimide resin, a polysiloxane resin, a fluorine-based resin, and a polyvinyl acetal resin.

(Gate Electrode)

The gate electrode may be of any type as long as it contains an electrically conductive material that can be used as an electrode, but it is preferable that the gate electrode have a light-blocking property. Here, the light-blocking property means that the transmittance of i-line (365 nm), h-line (405 nm) or g-line (436 nm) of a mercury lamp, which is an exposure light source used for patterning by photolithography, is 10% or less. Among them, the transmittance is preferably 1% or less, more preferably 0.1% or less.

Examples of the electrically conductive material include, but are not limited to, a metal such as platinum, gold, silver, copper, iron, tin, zinc, aluminum, indium, chromium, lithium, sodium, potassium, cesium, calcium, magnesium, palladium, molybdenum, amorphous silicon or polysilicon, or an alloy thereof; an inorganic electrically conductive substance such as copper iodide and copper sulfide; poly-thiophene, polypyrrole and polyaniline; a complex of polyethylene dioxythiophene and polystyrene sulfonate; an electrically conductive polymer having an electrical conductivity improved by, for example, doping with iodine etc.; a carbon material; and a material containing an organic component and an electrical conductor.

These electrode materials may be used alone, or may be used by laminating or mixing a plurality of materials.

The thickness of the gate electrode is preferably 30 nm or more and 500 nm or less. Within this range, it is easy to form a uniform thin film of the gate insulating layer while maintaining adhesion of the electrically conductive film to the substrate, so that variations in characteristics of the FET can be suppressed.

The gate electrode is arbitrary in width. The width of the electrode preferably 5 µm to 1 mm, but is not limited thereto.

(Gate Insulating Layer)

The material used for the gate insulating layer is not particularly limited, but includes an inorganic material such as silicon oxide or alumina; an organic material such as polyimide, polyvinyl alcohol, polyvinyl chloride, polyethylene terephthalate, polyvinylidene fluoride, polysiloxane or polyvinyl phenol; or a mixture of an inorganic material powder and an organic material. Among them, it is preferable to include an organic compound having a bond between a silicon atom and a carbon atom. Additionally, it is more preferable to include a metal compound having a bond between a metal atom and an oxygen atom.

The gate insulating layer may be a single layer or a plurality of layers. In addition, one layer may be formed of a plurality of insulating materials, or a plurality of insulating layers may be formed by laminating a plurality of insulating materials.

(Source/Drain Electrode and Wire)

The source/drain electrodes and the wires contain an electrically conductive component and an organic component, and are in a continuous phase. Specifically, it is necessary that the connecting portion between the source electrode and the wire form a continuous phase, and the connecting portion between the drain electrode and the wire form a continuous phase. The phrase "the source/drain electrodes and the wires are in a continuous phase" means that a material constituting the electrode and a material constituting the wire are mixed and integrated in such a manner that the concentration of the respective materials change stepwise, or the composition of the material constituting the electrodes is same as the composition of the material constituting the wires, so that at the connecting portion between them, there is no connection surface. The fact that the connecting portions between the source/drain electrodes and the wires are in a continuous phase can be confirmed by observing a cross section of the connecting portion with a scanning electron microscope (SEM), a transmission electron microscope (TEM) or the like. In the case of the continuous phase, it is possible to prevent the electrodes and the wires from peeling or chipping due to an environmental change such as a temperature or humidity change, or an external stress such as bending.

The source electrode, the drain electrode and the wires are preferably composed of the same material. This is because the number of types of materials to be used is reduced, so that the cost can be reduced.

The phrase "the source electrode, the drain electrode and the wires are composed of the same material" means that elements having the highest content molar ratio among elements contained in the source electrode, the drain electrode and the wire are the same. The type and content ratio of elements in the electrodes can be identified by elemental analysis such as X-ray photoelectron spectroscopy (XPS) or secondary ion mass spectrometry (SIMS).

In the FET according to an embodiment of the present invention, integrated values of optical reflectance at a region of a wavelength of 600 nm or more and 900 nm or less on the wires (integrated value A) are higher than integrated values of optical reflectance at a region of a wavelength of 600 nm or more and 900 nm or less on the source electrode and the drain electrode (integrated value B). More specifically, the integrated value A is preferably 5% or more higher than the integrated value B, more preferably 10% or more higher than the integrated value B. Since the integrated value A is higher than the integrated value B, it is easy to distinguish the source electrode, the drain electrode, and the wires in the inspection step. As a result, it is possible to enhance the accuracy of identifying defective formation of the source electrode and the drain electrode. The optical reflectance can be measured using microspectrophotometry. The integrated values A and B are calculated by the method described in Examples of the description. Note that the measurement positions of the source electrode, the drain electrode and the wires may be based on the positions of the source electrode, the drain electrode and the wires determined in the design stage of a field-effect transistor. In a case where it is difficult to determine the designed position, the measurement can be performed by determining the positions of the electrodes and the wires to be measured. Specific examples of the measurement position of the source electrode and the drain electrode include a position in the vicinity of the semiconductor layer of each electrode as the measurement position. In addition, in the source electrode and the drain electrode of a different field-effect transistor connected by the wires, the measurement position of the wires include an intermediate position between the vicinity of the semiconductor layer of the source electrode and the vicinity of the semiconductor layer of the drain electrode.

In addition, the average thicknesses of the source electrode and the drain electrode are preferably 10% or more thinner than the average thicknesses of the wires. Since different thicknesses cause different observation images in the inspection step, it is possible to further easily distinguish the wires from the source electrode and the drain electrode in the inspection step, and to further improve the accuracy of identifying defective formation of the source electrode and the drain electrode.

The average thickness can be measured by observing fracture surfaces of the source electrode, the drain electrode and the wires with an electron microscope. The thicknesses of the respective source electrode, drain electrode and wires are measured at arbitrary five positions, and an average value between them is adopted.

In addition, the arithmetic surface roughnesses (Ra) of the source electrode and the drain electrode are preferably larger than the arithmetic surface roughness of the wires. More specifically, the Ra of the source electrode and the drain electrode are preferably twice or more larger than the Ra of the wires. When the arithmetic surface roughnesses are different, the light scatterings are different, so that it is possible to further easily distinguish the wires from the source electrode and the drain electrode in the inspection step, and to further enhance the accuracy of identifying defective formation of the source electrode and the drain electrode.

The arithmetic surface roughness can be measured with an atomic force microscope (AFM). The Ra of the respective source electrode, drain electrode and wires are measured at arbitrary five positions, and an average value between them is adopted. The length measured by an AFM is changed depending on the areas of the source electrode, the drain electrode and the wires, and when the measurement can be performed at a width of 10 μm, the measurement is performed at a width of 10 μm. When the areas of the source electrode, the drain electrode and the wires are smaller than the above, the measurement is performed at the maximum measurable size.

The source electrode and the drain electrode are preferably 5 times or more and 50 times or less thicker than the gate electrode. Within this range, it is possible to reduce the disconnection probability of electrode due to roll tightening when an FET is formed by roll-to-roll using a flexible substrate while reducing the specific resistance value of electrode.

In addition, it is preferable that the elemental composition ratios of the electrically conductive component in the source electrode and the drain electrode on the surface of the continuous phase be 25% or less, and the elemental composition ratios of the electrically conductive component in the source electrode and the drain electrode on the surface of the continuous phase be higher than the elemental composition ratios of the electrically conductive component in the wires on the surface of the continuous phase. Specifically, it is preferable that the elemental composition ratios of the electrically conductive component in the source electrode and the drain electrode on the surface of a portion constituting the continuous phase be 25% or less, and the elemental composition ratios of the electrically conductive component in the source electrode and the drain electrode on the surface of a portion constituting the continuous phase be higher than the elemental composition ratios of the electrically conductive component in the wires on the surface of a portion constituting the continuous phase. More specifically, the elemental composition ratios of the electrically conductive component in the source electrode and the drain electrode on the surface of a portion constituting the continuous phase are preferably 3% or more higher than the elemental composition ratios of the electrically conductive component in the wires. When the elemental composition ratios of the electrically conductive component are 25% or less, it is possible to widen the margin of the threshold setting value for displaying the source electrode and the drain electrode in black when the binarization processing is performed in the image inspection step. In addition, when the elemental composition ratios of the electrically conductive component contained in the elemental composition of the source electrode and the drain electrode are 3% or more higher than the elemental composition ratios of the electrically conductive component in the elemental composition of the wires, the color tone of the wires can be different from the color tone of the source electrode and the drain electrode, so that a luminance difference between the wires, and the source electrode and the drain electrode increases, making it possible to further easily distinguish the wires from the source electrode and the drain electrode in the image inspection step, and to enhance the accuracy of identifying defective formation for the size, shape and the like of the source electrode and the drain electrode without increasing the number of times of image scanning during inspection.

The elemental composition ratio can be identified by elemental analysis such as X-ray photoelectron spectroscopy (XPS) or secondary ion mass spectrometry (SIMS). In any method, elemental analyses of the respective source electrode, drain electrode and wires are performed at arbitrary five positions, and an average value between them is adopted. When the measurement can be performed by any methods, the value measured by XPS is adopted. The measured size is changed depending on the areas of the source electrode, the drain electrode and the wires, and when the measurement can be performed at 10 μmφ, the measurement is performed at 10 μmφ. When the areas of the source electrode, the drain electrode and the wires are smaller than the above, the measurement is performed at the maximum measurable size, and analysis is performed at a depth of several nm from the surface.

In order to form the source electrode, the drain electrode and the wires as described above, it is preferable to manufacture the source electrode, the drain electrode and the wires in the same step. Details of the manufacturing method will be described below.

(Electrically Conductive Component)

The electrically conductive component used in the present invention refers to a metal and an inorganic electrical conductor, and examples thereof include gold, silver, copper, nickel, tin, bismuth, lead, zinc, palladium, platinum, aluminum, tungsten, molybdenum or carbon (C). The electrically conductive component is preferably an electrically conductive component containing at least one element selected from the group consisting of gold, silver, copper, nickel, tin, bismuth, lead, zinc, palladium, platinum, aluminum and carbon, more preferably silver. This is because an electrically conductive film and an electrically conductive pattern having excellent conductivity and stability are easily obtained.

The contents of the electrically conductive component in the source electrode and the drain electrode are preferably within a range of 70 mass % or more and 95 mass % or less when the masses of the source electrode and the drain electrode are 100 mass %. When the content of the electrically conductive component is within this range, the specific resistance value and the disconnection probability of electrode can be reduced.

(Organic Component)

The organic component used in the present invention is not particularly limited, but includes a monomer, an oligomer or a polymer, a photopolymerization initiator, a plasticizer, a leveling agent, a surfactant, a silane coupling agent, an antifoaming agent, and a pigment. From the viewpoint of improving bending resistance, an oligomer or a polymer is preferable.

The oligomer or polymer is not particularly limited, and examples thereof include an acrylic resin, an epoxy resin, a novolac resin, a phenol resin, a polyimide precursor, and a polyimide. Among them, from the viewpoint of crack resistance at the time of bending, an acrylic resin is preferable. This is presumed to be because the glass transition temperature of the acrylic resin is 100° C. or lower, so that the acrylic resin is softened during thermal curing of the electrically conductive film, and the binding between the electrical conductor particles is enhanced.

The acrylic resin is a resin containing at least a structure derived from an acryl-based monomer in the repeating unit. As a specific example of the acryl-based monomer, all compounds having a carbon-carbon double bond can be used, and preferable examples thereof include acryl-based monomers such as methyl acrylate, acrylic acid, 2-ethylhexyl acrylate, ethyl methacrylate, n-butyl acrylate, i-butyl acrylate, i-propane acrylate, glycidyl acrylate, N-methoxymethyl acrylamide, N-ethoxymethyl acrylamide, N-n-butoxymethyl acrylamide, N-isobutoxymethyl acrylamide, butoxytriethylene glycol acrylate, dicyclopentanyl acrylate, dicyclopentenyl acrylate, 2-hydroxyethyl acrylate, isobonyl acrylate, 2-hydroxypropyl acrylate, isodecyl acrylate, isooctyl acrylate, lauryl acrylate, 2-methoxyethyl acrylate, methoxyethylene glycol acrylate, methoxydiethylene glycol acrylate, octafluoropentyl acrylate, phenoxyethyl acrylate, stearyl acrylate, trifluoroethyl acrylate, acrylamide, aminoethyl acrylate, phenyl acrylate, 1-naphthyl acrylate, 2-naphthyl acrylate, thiophenol acrylate and benzyl mercaptan acrylate, those represented by replacing these acrylates by methacrylates, styrenes such as styrene, p-methylstyrene, o-methylstyrene, m-methylstyrene, α-methylstyrene, chloromethylstyrene and hydroxymethylstyrene, γ-methacryloxypropyltrimethoxysilane, and 1-vinyl-2 pyrrolidone.

These acryl-based monomers may be used alone or in combination of two or more.

(Semiconductor Layer)

The material used for the semiconductor layer is not particularly limited as long as it is a material exhibiting semiconductivity, and a material having high carrier mobility is preferably used. In addition, those to which a simple coating process at low cost can be applied are preferable, and preferable examples include organic semiconductors and carbon materials.

As the organic semiconductor, a publicly known one can be used such as pentacene, polythiophenes, compounds containing a thiophene unit in the main chain, polypyrroles, poly(p-phenylenevinylene)s, polyanilines, polyacetylenes, polydiacetylenes, polycarbazoles, polyfurans, polyheteroaryls each having a nitrogen-containing aromatic ring as a constituent unit, condensed polycyclic aromatic compounds, heteroaromatic compounds, aromatic amine derivatives, bis-carbazole derivatives, pyrazoline derivatives, stilbene-based compounds, hydrazone-based compounds, metal phthalocyanines such as copper phthalocyanine, metal porphyrins such as copper porphyrin, distyrylbenzene derivatives, aminostyryl derivatives, aromatic acetylene derivatives, condensed cyclic tetracarboxylic acid diimides, or organic dyes, and two or more of them may be contained.

The carbon materials include carbon nanotubes (hereinafter, referred to as CNTs), graphene and fullerene, but CNTs are preferable from the viewpoint of suitability for a coating process and high mobility.

As the CNTs, any of single-walled CNTs in which one carbon film (graphene sheet) is wound in a cylindrical shape, two-walled CNTs in which two graphene sheets are concentrically wound, and multi-walled CNTs in which a plurality of graphene sheets are concentrically wound may be used, or two or more types thereof may be used. From the viewpoint of exhibiting semiconductor characteristics, it is preferable to use single-walled CNTs, and among others, it is more preferable that single-walled CNTs contain 90 wt % or more semiconductor-type single-walled CNTs. More preferably, the single-walled CNTs contain 95 wt % or more semiconductor-type single-walled CNTs.

Furthermore, CNTs having a conjugated polymer attached to at least a part of the surface (hereinafter, referred to as a CNT composite) are particularly preferable because they have excellent dispersion stability in a solution and high mobility is achieved. Here, the conjugated polymer refers to a compound in which the repeating unit has a conjugated structure and the degree of polymerization is 2 or more.

The state in which a conjugated polymer is attached to at least a part of the surface of CNTs means a state in which a part or the whole of the surface of CNTs is coated with the conjugated polymer. The reason why a conjugated polymer can cover CNTs is presumed to be that an interaction occurs due to overlapping of π electron clouds derived from the respective conjugated structures. Whether or not CNTs are coated with a conjugated polymer can be determined based on whether the reflection color of the coated CNTs is brought from the color of the uncoated CNTs to the color of the conjugated polymer. Quantitatively, the presence of deposits and the mass ratio of the deposits to CNTs can be identified by elemental analysis such as X-ray photoelectron spectroscopy (XPS).

The conjugated polymer to be attached to CNTs can be used regardless of the molecular weight, molecular weight distribution or structure. From the viewpoint of easy attachment to CNTs, the conjugated polymer preferably has a weight average molecular weight of 1000 or more.

The method for attaching a conjugated polymer to CNTs include (I) a method in which CNTs are added to and mixed with a molten conjugated polymer, (II) a method in which a conjugated polymer is dissolved in a solvent, and then CNTs are added to and mixed with the solvent, (III) a method in which CNTs are preliminarily dispersed in a solvent by ultrasonic waves or the like in advance, and then a conjugated polymer is added to and mixed with the solvent, and (IV) a method in which a conjugated polymer and CNTs are placed in a solvent, and this mixture is irradiated with ultrasonic waves to be mixed. In the present invention, a plurality of methods may be combined.

In an embodiment of the present invention, the length of CNT is preferably shorter than the distance between the source electrode and the drain electrode (channel length). The average length of the CNTs depends on the channel length, but is preferably 2 µm or less, more preferably 0.5 µm or less. Since commercially available CNTs are generally distributed in length and may contain CNTs longer than the channel length, it is preferable to add a step of making the CNTs shorter than the channel length. For example, a method of cutting into a short fiber form by an acid treatment with nitric acid, sulfuric acid or the like, an ultrasonic treatment, a freeze pulverization method or the like is effective. In addition, it is more preferable to use separation by a filter in combination from the viewpoint of improving the purity.

The diameters of CNTs are not particularly limited, but are preferably 1 nm or more and 100 nm or less, more preferably 50 nm or less.

The conjugated polymer covering CNTs includes a polythiophene-based polymer, a polypyrrole-based polymer, a polyaniline-based polymer, a polyacetylene-based polymer, a poly-p-phenylene-based polymer, a poly-p-phenylenevinylene-based polymer, and a thiophene-heteroarylene-based polymer having a thiophene unit and a heteroaryl unit in the repeating unit, and two or more of them may be used. As the polymer, a polymer in which single monomer units are arranged, a polymer obtained by block copolymerization of different monomer units, a polymer obtained by random copolymerization, a polymer obtained by graft polymerization, or the like can be used.

In addition, a CNT composite and an organic semiconductor may be mixed and used as the semiconductor layer. By uniformly dispersing the CNT composite in the organic semiconductor, high mobility can be achieved while maintaining the characteristics of the organic semiconductor itself.

In addition, the semiconductor layer may further contain an insulating material. The insulating material used here includes, but is not particularly limited to, the insulating material composition used in the present invention, and polymer materials such as poly(methyl methacrylate), polycarbonate and polyethylene terephthalate.

The semiconductor layer may be a single layer or a plurality of layers, and the film thickness is preferably 1 nm or more and 200 nm or less, more preferably 100 nm or less. By setting the film thickness in this range, uniform thin film formation is facilitated, and furthermore, a current between source and drain that cannot be controlled by a gate voltage can be suppressed, and the ON/OFF ratio of the FET can be further increased. The film thickness can be measured by an atomic force microscope, an ellipsometry method, or the like.

In addition, an alignment layer can also be provided between the gate insulating layer and the semiconductor layer. For the alignment layer, a publicly known material such as a silane compound, a titanium compound, an organic acid or a heterorganic acid can be used, and an organic silane compound is particularly preferable.

In the present invention, a second insulating layer may be formed on a side opposite to the gate insulating layer with respect to the semiconductor layer. As a result, the semiconductor layer can be protected from an external environment such as oxygen or moisture.

The material used for the second insulating layer is not particularly limited, but specific examples thereof include an inorganic material such as silicon oxide and alumina, a polymer material such as polyimide and a derivative thereof, polyvinyl alcohol, polyvinyl chloride, polyethylene terephthalate, polyvinylidene fluoride, polysiloxane and a derivative thereof, and polyvinylphenol and a derivative thereof, a mixture of an inorganic material powder and a polymer material, and a mixture of an organic low molecular weight material and a polymer material.

In the formed FET, a current flowing between the source electrode and the drain electrode can be controlled by changing a gate voltage. The mobility serving as an index of the performance of the FET can be calculated using the following Formula (a).

$$\mu=(\delta Id/\delta Vg)L \cdot D/(W \cdot \varepsilon r \cdot \varepsilon \cdot Vsd) \tag{a}$$

wherein Id is a current between source and drain, Vsd is a voltage between source and drain, Vg is a gate voltage, D is a thickness of the gate insulating layer, L is a channel length, W is a channel width, εr is a relative dielectric constant of the gate insulating layer, and ε is a dielectric constant of vacuum (8.85×10$^{-12}$ F/m).

The FET formed by the above-mentioned method has high mobility, and the relative positions of the gate electrode, the source electrode and the drain electrode are controlled with high accuracy.

<Method for Manufacturing Field-Effect Transistor>

A method for manufacturing the FET according to an embodiment of the present invention preferably includes a step of forming a gate electrode on a surface of a substrate; a step of forming a gate insulating layer on the gate electrode; a step of forming a semiconductor layer on the gate insulating layer by a coating method; a step of forming an electrically conductive film by applying an electrically conductive paste containing electrically conductive particles and a photosensitive organic component onto the gate electrode; a step of exposing the electrically conductive film to patterns of a source electrode and a drain electrode using a photomask and the gate electrode as a mask from the back surface side of the substrate; a step of exposing the electrically conductive film to patterns of wires using a photomask from the front surface side of the substrate; and a step of developing the exposed electrically conductive film to form the source electrode, the drain electrode and the wires.

Hereinafter, a specific description is made of an example of the method for manufacturing the FET according to the embodiment 2 of the present invention illustrated in FIG. 2.

Figure 3A:
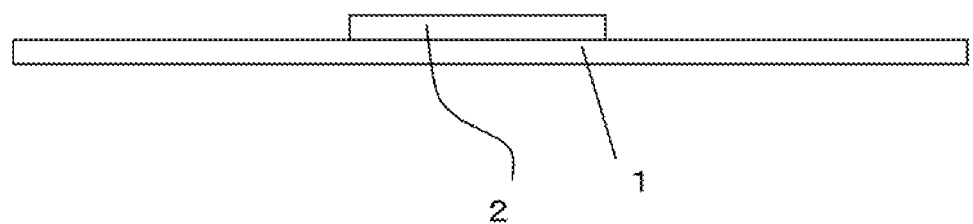
FIG. 3A is a cross-sectional view of steps illustrating a method for manufacturing the field-effect transistor according to an embodiment 2 of the present invention.
Figure 3A:
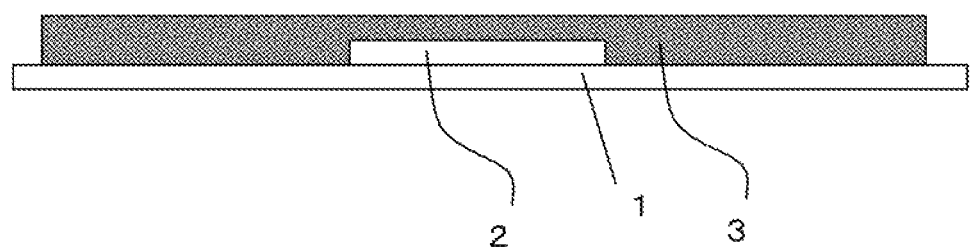
Figure 3A:
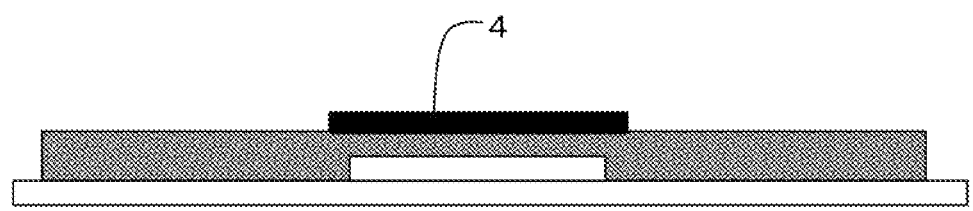
Figure 3A:
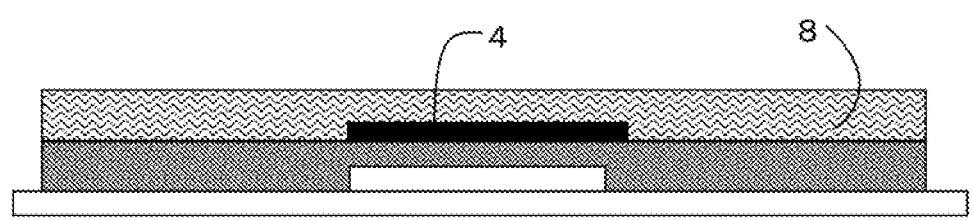

First, as illustrated in FIG. 3A(a), the gate electrode 2 is formed on the substrate 1. The method for forming the gate electrode includes a method using a known technique such as resistance heating vapor deposition, electron beam, sputtering, plating, CVD, ion plating coating, inkjet or printing, and a forming method in which a paste containing an organic component and an electrical conductor is applied onto an insulating substrate by a publicly known technique such as a spin coating method, a blade coating method, a slit die coating method, a screen printing method, a bar coater method, a casting method, a print transfer method, or a dipping and pulling method, and drying is performed using an oven, a hot plate, infrared rays or the like, but is not particularly limited as long as electrical conduction can be achieved.

As a method for pattern-forming the gate electrode, the electrode thin film produced by the above-mentioned method may be pattern-formed in a desired shape by a publicly known photolithography method or the like, or may be pattern-formed through a mask having a desired shape during vapor deposition or sputtering of the electrode and wire material. In addition, the pattern may be directly formed using inkjet or a printing method. By the above-mentioned method, for example, vacuum deposition through a mask is performed for the formation.

Next, as illustrated in FIG. 3A(b), the gate insulating layer 3 is formed on the gate electrode 2. The method for forming the gate insulating layer includes, but is not limited to, publicly known techniques such as resistance heating vapor deposition, electron beam, sputtering, plating, CVD, ion plating coating, inkjet, printing, a spin coating method, a blade coating method, a slit die coating method, a bar coater method, a casting method, a print transfer method, and a dipping and pulling method.

The temperature for heat treatment of the print film is preferably within the range of 80 to 300° C.

Next, as illustrated in FIG. 3A(c), a solution containing CNTs is applied onto the gate insulating layer 3 to form the semiconductor layer 4. As a method for forming the semiconductor layer 4, it is preferable to use a coating method from the viewpoint of manufacturing cost and adaptation to a large area. The coating method includes publicly known coating methods such as a spin coating method, a blade coating method, a slit die coating method, a screen printing method, a bar coating method, a casting method, a printing transfer method, a dipping and pulling method, and an inkjet method. Among them, the coating method is preferably any one selected from the group consisting of an inkjet method, a dispenser method, and a spray method. Furthermore, from the viewpoint of the use efficiency of the raw material, an inkjet method is more preferable. From these coating methods, an appropriate coating method can be selected depending on the coating film properties to be achieved, such as thickness control and alignment control of a coating film.

The formed coating film may be subjected to an annealing treatment in the atmosphere, under reduced pressure, or under an inert gas atmosphere (under a nitrogen or argon atmosphere).

Next, as illustrated in FIG. 3A(d), an electrically conductive paste containing an electrical conductor and a photosensitive organic component is applied onto the gate insulating layer 3 and the semiconductor layer 4 by a printing method, and a solvent is removed to form an electrically conductive film 8. The method for removing a solvent includes heating and drying with an oven, a hot plate, infrared rays, or the like, and vacuum drying. The heating and drying is preferably performed at 50° C. to 180° C. for 1 minute to several hours.

Figure 3B:
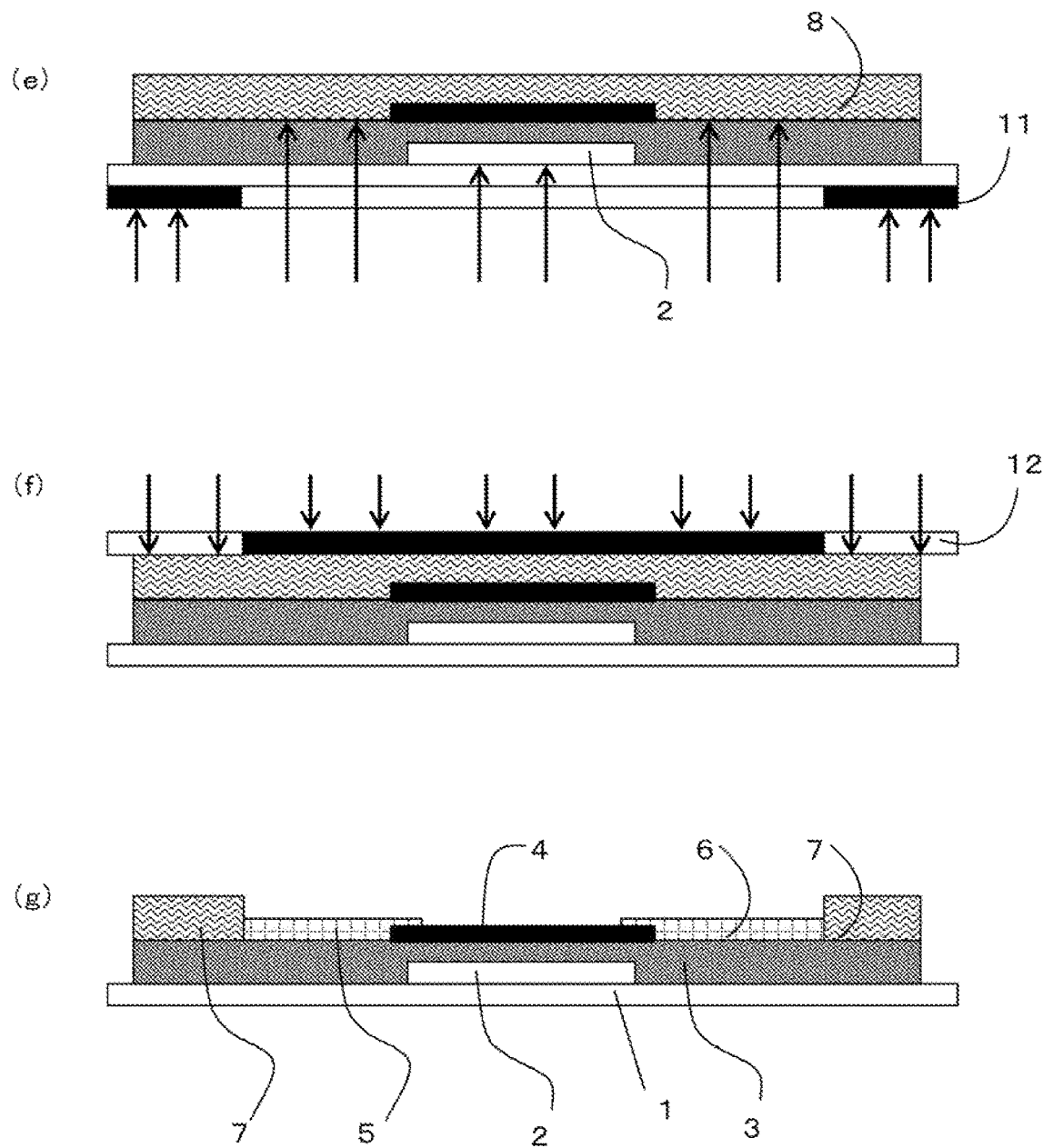
FIG. 3B is a cross-sectional view of steps illustrating a method for manufacturing the field-effect transistor according to an embodiment 2 of the present invention.

Next, as illustrated in FIG. 3B(e), the electrically conductive film 8 is exposed to the patterns of the source electrode and the drain electrode from the back surface side of the substrate using a photomask 11 and the gate electrode 2 as a mask. As a light source used for exposure, it is preferable to use i-line (365 nm), h-line (405 nm), or g-line (436 nm) of a mercury lamp. According to such back surface exposure, the exposure is blocked with the gate electrode pattern, so that a channel region following the gate electrode pattern is formed, and frames of the source electrode and the drain electrode defined by the photomask are simultaneously formed. Accordingly, the gate electrode, the source electrode and the drain electrode can be aligned with high accuracy.

Next, as illustrated in FIG. 3B(f), the electrically conductive film 8 is exposed using a photomask 12 from the front surface side of the substrate to form the wire pattern. As a light source used for exposure, it is preferable to use i-line (365 nm), h-line (405 nm), or g-line (436 nm) of a mercury lamp.

Next, as illustrated in FIG. 3B(g), the exposed electrically conductive film 8 is developed to form the source electrode 5, the drain electrode 6 and the wires 7. For the development, a publicly known method such as alkali development or organic development can be used depending on the type of the electrically conductive paste to be used.

After the development, a rinsing treatment with water may be performed. Here, alcohols such as ethanol and isopropyl alcohol, esters such as ethyl lactate and propylene glycol monomethyl ether acetate, or the like may be added to the water for the rinsing treatment.

Next, the source electrode 5, the drain electrode 6 and the wires 7 are cured in order to develop electrical conductivity. The curing method includes thermal curing with an oven, an inert oven, a hot plate, infrared rays or the like, vacuum curing, and curing with a xenon flash lamp. In the case of thermal curing, the curing temperature is preferably in the range of 100° C. or more and 300° C. or less, more preferably 100° C. or more and 200° C. or less, still more preferably 120° C. or more and 180° C. or less. By setting the heating temperature to 120° C. or higher, the volume shrinkage amount of the photosensitive organic component of the resin can be increased, and the specific resistivity is lowered.

The electrically conductive paste used in an embodiment of the present invention is preferably one that can provide high electrical conductivity by curing at a relatively low temperature of 180° C. or lower. In that case, the electrically conductive paste can be used on a substrate having low heat resistance or in combination with a material having low heat resistance.

In the steps illustrated in FIGS. 3B(e) and 3B(f), contact exposure in which the photomask is in contact with the surface to be exposed is used, but proximity exposure in which the photomask is not in contact with the surface to be exposed may be used.

In addition, the steps illustrated in FIGS. 3B(e) and 3B(f) may be performed in this order or in the reverse order, or these steps may be performed simultaneously, in other words, exposure may be performed simultaneously from the back surface side and from the front surface side.

Figure 3C:
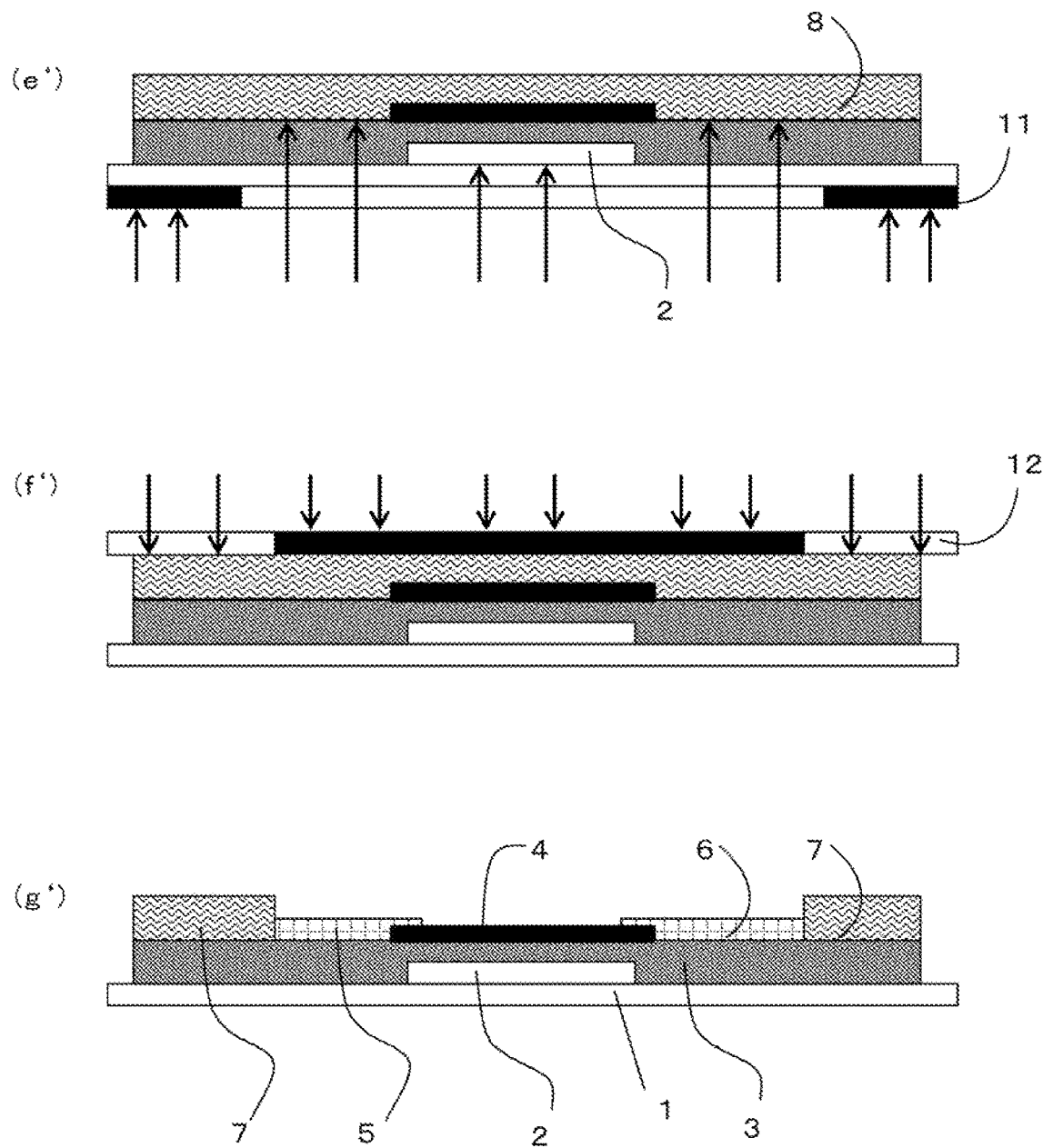
FIG. 3C is a cross-sectional view of steps illustrating a partially modified method for manufacturing the field-effect transistor according to an embodiment 2 of the present invention.

In addition, as illustrated in FIGS. 3C(e') to 3C(f'), the exposure regions of the photomask 11 and the photomask 12 may be partially overlapped in exposure. In this case, the exposed overlapped regions are formed as wires 7 after development.

In addition, as an example of the case of manufacturing the FET according to the embodiment 1 of the present invention illustrated in FIG. 1, after the steps illustrated in FIGS. 3A(a) to 3(b) are performed, the step of forming the semiconductor layer 4 illustrated in FIG. 3A(c) may be skipped, the steps illustrated in FIGS. 3A(d) and 3B(e) to 3B(g) may be performed, and finally, the semiconductor layer 4 may be formed between the source electrode 5 and the drain electrode 6.

The exposure amount in the step of exposing from the back surface side is preferably half or less of the exposure amount in the step of exposing from the front surface side. As a result, it is possible to enhance the processing accuracy of the source electrode and the drain electrode.

According to the method for manufacturing an FET according to the present embodiment, the electrically conductive film 8 is cured from the side of the interface with the gate insulating layer in the back surface exposure step, whereas the electrically conductive film 8 is cured from the opposite side (front surface side) in the front surface exposure step. Accordingly, after the development, the surface state of the source electrode and the drain electrode patterned by the back surface exposure can be made different from the surface state of the wires patterned by the front surface exposure.

As described above, when the FET according to an embodiment of the present invention is manufactured, the surface states of the wires, the source electrode and the drain electrode can be separately formed from the electrically conductive film made of the same material by a photolithography method. Accordingly, it is possible to manufacture an FET in which wires are easily distinguished from a source electrode and a drain electrode by a simple process and at low cost.

(Electrically Conductive Paste)

The electrically conductive paste used in an embodiment of the present invention contains at least electrically conductive particles and a photosensitive organic component. The electrically conductive paste is produced by mixing necessary materials and then using, for example, a disperser or a kneader such as a three-roll roller, a ball mill or a planetary ball mill.

(Electrically Conductive Particles)

Examples of the electrically conductive particles include gold, silver, copper, nickel, tin, bismuth, lead, zinc, palladium, platinum, aluminum, tungsten, molybdenum or carbon. Among them, the electrically conductive particles are preferably electrically conductive particles containing at least one element selected from the group consisting of gold, silver, copper, nickel, tin, bismuth, lead, zinc, palladium, platinum, aluminum and carbon, more preferably silver particles.

(Photosensitive Organic Component)

The photosensitive organic component is preferably one containing a monomer, an oligomer, or a polymer having a polymerizable unsaturated group in the molecule. Examples of the polymerizable unsaturated group include an ethylenically unsaturated group such as a vinyl group, an allyl group, an acrylate group or a methacrylate group, or an acrylamide group.

(Photopolymerization Initiator/Sensitizer)

In order to photocure the photosensitive organic component as described above through photoreaction, the electrically conductive paste preferably contains a photopolymerization initiator. Examples of the photopolymerization initiator include a photoradical polymerization initiator or a photocationic polymerization initiator, but the photopolymerization initiator may be appropriately selected depending on light used in the exposure step.

In addition, using a sensitizer together with the photopolymerization initiator in the electrically conductive paste can improve the sensitivity, and expand the wavelength range effective for the reaction.

(Solvent)

The electrically conductive paste preferably contains an organic solvent from the viewpoint of adjusting the viscosity and improving the surface smoothness of a coating film. The electrically conductive paste viscosity (value measured at 3 rpm with a Brookfield-type viscometer) is preferably 10 to 100 Pa·s, more preferably 10 to 50 Pa·s, from the viewpoint of preventing defective coating due to sedimentation of electrically conductive particles or liquid dripping, or improving coatability.

Examples of the organic solvent include methyl ethyl ketone, dioxane, acetone, cyclohexanone, cyclopentanone, isobutyl alcohol, isopropyl alcohol, tetrahydrofuran, γ-butyrolactone, bromobenzene, chlorobenzene, dibromobenzene, dichlorobenzene, bromobenzoic acid, chlorobenzoic acid, diethylene glycol monoethyl ether acetate, diethylene glycol monobutyl ether, diethylene glycol monobutyl ether acetate, 2-methyl-2,4-pentanediol, 3-methyl-1,5-pentanediol, 2-ethyl-1,3-hexanediol, terpineol, 3-methyl-3-methoxybutanol, texanol, benzyl alcohol, dipropylene glycol monoethyl ether, tripropylene glycol monomethyl ether, or propylene glycol monomethyl ether acetate.

(Other Components)

In the electrically conductive paste, for example, an additive such as an organic or inorganic pigment, a glass powder, a filler, a plasticizer, a leveling agent such as a special vinyl-based polymer or a special acryl-based polymer, a surfactant, a silane coupling agent, an antifoaming agent, or an antioxidant may be blended.

<Wireless Communication Device>

Next, a description is made of a wireless communication device containing the FET according to an embodiment of the present invention. The wireless communication device is a device, such as RFID, that performs electrical communication by receiving with an RFID tag a carrier wave transmitted from an antenna mounted on an external reader/writer.

As a specific operation, for example, the antenna of the RFID tag receives a radio signal transmitted from the antenna mounted on the reader/writer, and the FET in the RFID performs an operation according to the command of the radio signal. Thereafter, an answer of a result according to the command is transmitted as a radio signal from the antenna of the RFID tag to the antenna of the reader/writer. The operation according to the command is performed by a publicly known demodulation circuit, an operation control logic circuit, a modulation circuit, or the like composed of an FET.

Figure 4:
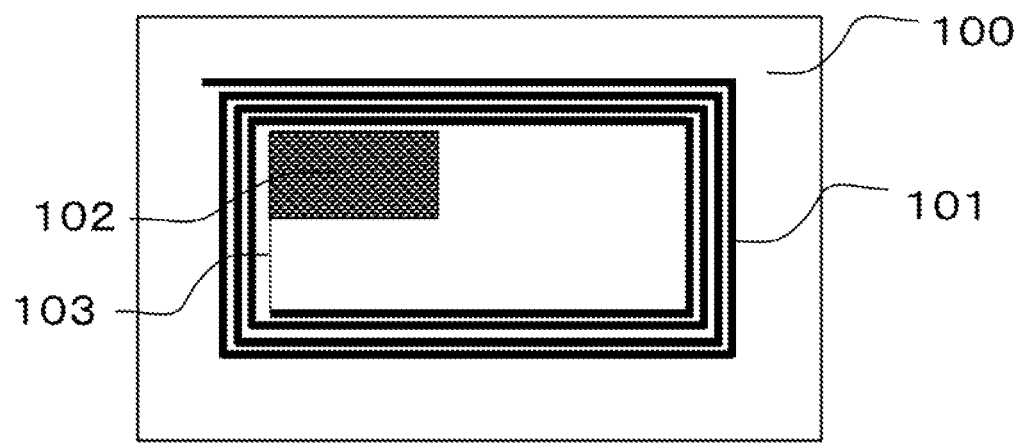
FIG. 4 is a schematic view illustrating an example of a wireless communication device according to an embodiment of the present invention.
Figure 5:
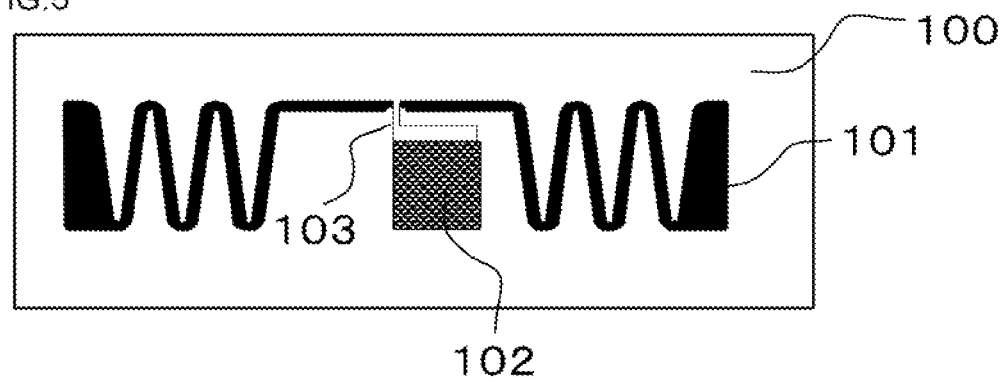
FIG. 5 is a schematic view illustrating an example of a wireless communication device according to an embodiment of the present invention.

The wireless communication device according to an embodiment of the present invention includes at least the above-mentioned FET and an antenna. As a more specific configuration of the wireless communication device according to an embodiment of the present invention, as illustrated as an example in FIGS. 4 and 5, an antenna pattern 101, a circuit 102 containing an FET, and a connection wire 103 between the circuit and the antenna are provided on a substrate 100.

The antenna material and the connection wire material may be any electrically conductive material. The specific materials include the same materials as those for the gate electrode material. Among them, a paste material containing an electrical conductor and a binder is preferable from the viewpoint that flexibility is increased, and adhesion is good and electrical connection is good even at the time of bending. The antenna material and the connection wire material are preferably the same material from the viewpoint of reducing the manufacturing cost.

The method for forming the antenna pattern and the connection wire pattern includes a method in which a metal foil such as a copper foil or an aluminum foil is processed using a punching blade and transferred to a substrate, a method in which a metal foil attached to a substrate is etched using a resist layer formed on the metal foil as a mask, and a method in which a pattern of an electrically conductive paste is formed on a substrate by a coating method and the pattern is cured with heat or light. Among them, from the viewpoint of reducing the manufacturing cost, a method including applying an electrically conductive paste to a substrate to form the patterns is preferable.

When a paste containing an electrical conductor and a binder is used as the material, the method includes a method in which the paste is applied onto a substrate using a publicly known technique such as a spin coating method, a blade coating method, a slit die coating method, a screen printing method, a bar coater method, a casting method, a printing transfer method or a dipping and pulling method, and dried using an oven, a hot plate, infrared rays or the like. In addition, the electrically conductive film produced by the above-mentioned method may be pattern-formed in a desired shape by a publicly known photolithography method or the like, or may be pattern-formed through a mask having a desired shape at the time of vapor deposition or sputtering.

Furthermore, the antenna pattern and the connection wire pattern are preferably made of the same material as that for the gate electrode and the wires of the FET. This is because the number of manufacturing steps can be reduced and the cost can be reduced by producing the antenna pattern and the connection wire pattern, and the gate electrode and the wires of the FET in the same step.

The fact that the antenna pattern and the connection wire pattern, and the gate electrode and the wires of the FET are made of the same material means that elements having the highest content molar ratio among elements contained in the antenna pattern and the connection wire pattern, and the gate electrode and the wires of the FET are the same. The type and content ratio of elements in the antenna pattern and the connection wire pattern, and the gate electrode and the wires of the FET can be identified by elemental analysis such as X-ray photoelectron spectroscopy (XPS) or secondary ion mass spectrometry (SIMS).

When the antenna pattern and the connection wire pattern, and the gate electrode and the wires of the FET are produced in the same step, the connecting portions between the antenna pattern and the connection wire pattern, and the connection wire pattern and the wire for the gate electrode of the FET are formed in a continuous phase. From the viewpoint of adhesion of the antenna pattern and the connection wire pattern, and the gate electrode and the wires of the FET, and reduction in manufacturing cost, it is preferable to form a continuous phase. The fact that the antenna pattern and the connection wire pattern, and the gate electrode and the wire pattern of the FET are in a continuous phase means that these patterns are integrated and there is no connection interface at the connecting portion. The fact that the connecting portions are in a continuous phase can be confirmed by observing a cross section of the connecting portion with a scanning electron microscope (SEM), a transmission electron microscope (TEM) or the like.

The widths and thicknesses of the connecting portions between the antenna pattern and the connection wire pattern, and the connection wire pattern and the wire for the gate electrode of the FET are arbitrary.

EXAMPLES

Hereinafter, a more specific description is made of the present invention with reference to Examples. It should be noted that the present invention is not limited to the following Examples. Descriptions are made of respective evaluation methods in Examples in the following [1] to [9].

[1] Measurement of Optical Reflectance of Source/Drain Electrode and Wire

The optical reflectances of the source electrode, the drain electrode and the wires were measured. For the measurement, a microspectroscopic film thickness meter (OPTM F2 manufactured by Otsuka Electronics Co., Ltd.) was used. The measurement range was set to a wavelength of 400 nm to 1000 nm. The source electrode, the drain electrode and the wires were measured at arbitrary five positions in each region of the source electrode, the drain electrode and the wires designed in a photomask used in the FET fabrication. The integrated values of the optical reflectance at a wavelength of 600 nm or more and 900 nm or less were averaged, and from these respective values, the reflectance ratio (source-drain electrode/wire) was calculated.

[2] Edge Detection for Source/Drain Electrode and Wire

Edge detection for the source electrode, the drain electrode and the wires was performed. For the measurement, edge detection of obtained images of 20 elements for the source electrode, the drain electrode and the wire was performed using an optical microscope ECLIPSE L200N (manufactured by Nikon Instech Co., Ltd.), and evaluation was performed according to the following criteria.

A (good): The edge was detectable for all 20 elements, and the source electrode and the drain electrode were image-recognized.

B (possible): The edge was detectable for 15 or more and 19 or less elements, but for elements by which the edge was not detected, the source electrode and the drain electrode were not image-recognized.

C (impossible): The edge was detectable for 14 or less elements, but for elements by which the edge was not detected, the source electrode and the drain electrode were not image-recognized.

[3] Evaluation of Cross-Sectional Image of Source/Drain Electrode and Wire

Figure 6:
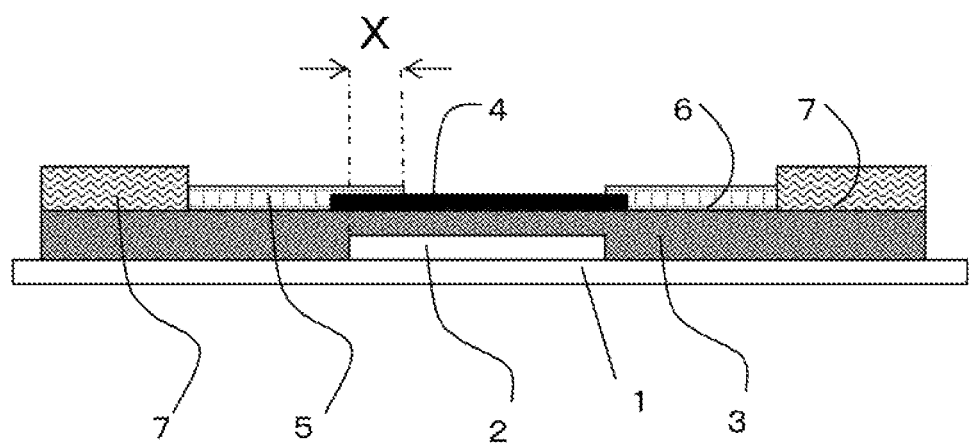
FIG. 6 is a cross-sectional view illustrating a method for evaluating misalignment between a gate electrode and a source/drain electrode.

A description is made with reference to FIG. 6. The cross section of the formed FET was observed using a scanning electron microscope (SEM) at a magnification of 1,000 to 15,000 to evaluate the presence or absence of a joint surface in the cross sections of the source electrode 5 and the wire 7, and the drain electrode 6 and the wire 7. Ten elements were measured and evaluated, and when no joint surface was observed, it was judged as "absent". When "absent", the electrode and the wire shall form a continuous phase.

[4] Evaluation of Misalignment Between Gate Electrode and Source/Drain Electrode A description is made with reference to FIG. 6. With respect to the formed FET, the cross sections of arbitrary 20 elements were observed using a scanning electron microscope (SEM), and a length X of an overlapping portion between the gate electrode 2 and the source electrode 5 or the drain electrode 6 was measured for each element. The average value of X for 20 elements was calculated. When the gate electrode 2 has an overlapping portion with both the source electrode 5 and the drain electrode 6, the length of the longer overlapping portion was defined as X.

[5] Evaluation of Mobility of FET

Current between source and drain (Id)-voltage between source and drain (Vsd) characteristics when the gate voltage (Vg) of the FET was changed were measured. The measurement was performed in the atmosphere using a semiconductor characteristics evaluation system model 4200-SCS (manufactured by Keithley Instruments). The mobility was determined from a change in the value of Id at Vsd=−5 V when Vg was changed from +20 V to −20 V.

[6] Measurement of Arithmetic Surface Roughness

The arithmetic surface roughnesses (Ra) of the source electrode, the drain electrode and the wires were measured. For the measurement, Ra at arbitrary five positions on the surfaces of the source electrode, the drain electrode and the wires were acquired using an atomic force microscope (AFM), and the average value was calculated.

[7] Measurement of Thickness

The film thicknesses of the source electrode, the drain electrode and the wires were measured. For the measurement, the cross sections of the elements were observed using a scanning electron microscope (SEM), the thicknesses of arbitrary five points of the source electrode, the drain electrode and the wires were measured, and the average value was calculated.

[8] Measurement of Elemental Composition Ratio

The elemental composition ratios of the source electrode, the drain electrode and the wires were measured. For the measurement, the ratios of silver component were calculated from the average values obtained by measuring the elemental composition ratios on the surfaces of the source electrode, the drain electrode and the wires at arbitrary five positions using X-ray photoelectron spectroscopy (XPS).

[9] Edge Detection by Luminance Difference for Source/Drain Electrode and Wire

Edge detection for the source electrode, the drain electrode and the wires was performed. Using a telecentric microlens (KEYENCE CORPORATION) to which lens a monochrome line camera was connected, an LED illumination LFV3-G-50X100SW (CCS, Ltd) as a light source, and an aluminum stage whose surface was processed with black alumite as an inspection stage, the source electrode, the drain electrode and the wires were image-recognized based on a difference in luminance value of the obtained binarized image of 20 elements for the source electrode, the drain electrode and the wires.

A (good): The edge was detectable for all 20 elements, and the source electrode and the drain electrode were image-recognized.

B (possible): The edge was detectable for 15 or more and 19 or less elements, but for elements by which the edge was not detected, the source electrode and the drain electrode were not image-recognized.

C (impossible): The edge was detectable for 14 or less elements, but for elements by which the edge was not detected, the source electrode and the drain electrode were not image-recognized.

Synthesis Example 1; Compound P1
(Photosensitive Organic Component)

Copolymerization ratio (mass basis): Ethyl acrylate (hereinafter, "EA")/2-ethylhexyl methacrylate (hereinafter, "2-EHMA")/styrene (hereinafter, "St")/glycidyl methacrylate (hereinafter, "GMA")/acrylic acid (hereinafter, "AA") =20/40/20/5/15.

Into a reaction vessel in a nitrogen atmosphere was charged 150 g of diethylene glycol monoethyl ether acetate (hereinafter, "DMEA"), followed by temperature rising to 80° C. using an oil bath. To this was added dropwise a mixture of 20 g of EA, 40 g of 2-EHMA, 20 g of St, 15 g of AA, 0.8 g of 2,2'-azobisisobutyronitrile and 10 g of DMEA over 1 hour. After completion of the dropwise addition, a polymerization reaction was further performed for 6 hours. Thereafter, 1 g of hydroquinone monomethyl ether was added to stop the polymerization reaction. Subsequently, a mixture of 5 g of GMA, 1 g of triethylbenzylammonium chloride and 10 g of DMEA was added dropwise over 0.5 hours. After completion of the dropwise addition, an addition reaction was further performed for 2 hours. The obtained reaction solution was purified with methanol to remove unreacted impurities, and further dried under vacuum for 24 hours to yield a compound P1.

Synthesis Example 2; Compound P2
(Photosensitive Organic Component)

Copolymerization ratio (mass basis): Bifunctional epoxy acrylate monomer (epoxy ester 3002A; manufactured by Kyoeisha Chemical Co., Ltd.)/bifunctional epoxy acrylate monomer (epoxy ester 70PA; manufactured by Kyoeisha Chemical Co., Ltd.)/GMA/St/AA=20/40/5/20/15.

Into a reaction vessel in a nitrogen atmosphere was charged 150 g of diethylene glycol monoethyl ether acetate (hereinafter, "DMEA"), followed by temperature rising to 80° C. using an oil bath. To this was added dropwise a mixture of 20 g of epoxy ester 3002A, 40 g of epoxy ester 70PA, 20 g of St, 15 g of AA, 0.8 g of 2,2'-azobisisobutyronitrile and 10 g of DMEA over 1 hour. After completion of the dropwise addition, a polymerization reaction was further performed for 6 hours. Thereafter, 1 g of hydroquinone monomethyl ether was added to stop the polymerization reaction. Subsequently, a mixture of 5 g of GMA, 1 g of triethylbenzylammonium chloride and 10 g of DMEA was added dropwise over 0.5 hours. After completion of the dropwise addition, an addition reaction was further performed for 2 hours. The obtained reaction solution was purified with methanol to remove unreacted impurities, and further dried under vacuum for 24 hours to yield a compound P2.

Synthesis Example 3; Compound P3
(Photosensitive Organic Component)

Urethane-Modified Compound of Compound P2
Into a reaction vessel in a nitrogen atmosphere was charged 100 g of diethylene glycol monoethyl ether acetate (hereinafter, "DMEA"), followed by temperature rising to 80° C. using an oil bath. To this was added dropwise a mixture of 10 g of the photosensitive component P2, 3.5 g of n-hexyl isocyanate and 10 g of DMEA over 1 hour. After completion of the dropwise addition, the reaction was further performed for 3 hours. The obtained reaction solution was purified with methanol to remove unreacted impurities, and further dried under vacuum for 24 hours to yield a compound P3 having a urethane bond.

Synthesis Example 4; Compound P4
(Photosensitive Organic Component)

Into a reaction vessel in a nitrogen atmosphere were charged 24.6 g of DMEA, 43.0 g of EOCN-1035 (Manufactured by Nippon Kayaku Co., Ltd.; Cresol novolac epoxy resin; epoxy equivalent: 10.7 g/equivalent), 14.4 g of AA, 0.24 g of 2,6-di-tert-butyl-p-cresol and 0.24 g of triphenylphosphine, followed by heating for reaction at a temperature of 98° C. until the acid value of the reaction solution reached 0.5 mg·KOH/g or less, to yield an epoxy carboxylate compound. Subsequently, into this reaction solution were charged 8.5 g of DMEA and 10.0 g of tetrahydrophthalic anhydride, followed by heating for reaction at 95° C. for 4 hours to yield a carboxylic acid-modified compound P4.

Preparation Example 1; Photosensitive Paste A

In a 100 ml clean bottle were put 16 g of the obtained compound P1 as described above, 4 g of the compound P3, 2 g of LIGHT ACRYLATE BP-4EA (manufactured by Kyoeisha Chemical Co., Ltd.), 4 g of a photopolymerization initiator OXE-01 (manufactured by BASF Japan Ltd.), 0.6 g of an acid generator SI-110 (manufactured by Sanshin Chemical Industry Co., Ltd.) and 10 g of γ-butyrolactone (manufactured by Mitsubishi Gas Chemical Company, Inc.), followed by mixing using a rotation-revolution vacuum mixer "Awatori Rentaro" (registered trademark) (ARE-310; manufactured by THINKY CORPORATION) to yield 34.6 g of a photosensitive resin solution (solid content: 78.5 mass %). The obtained photosensitive resin solution (8.0 g) and Ag particles (42.0 g) having an average particle diameter of 2 μm were mixed together, and the mixture was kneaded using a three-roll roller "EXAKT M-50" (Trade name: manufactured by EXAKT) to yield 50 g of a photosensitive paste A.

Preparation Example 2; Photosensitive Paste B

A photosensitive paste B was obtained in the same manner as in Preparation Example 1 except that Ag particles having an average particle diameter of 0.2 μm were used.

Preparation Example 3; Photosensitive Paste C

A photosensitive paste C was obtained in the same manner as in Preparation Example 2 except that 20 g of the compound P1 was used but the compound P3 was not used.

Preparation Example 4; Photosensitive Paste D

A photosensitive paste D was obtained in the same manner as in Preparation Example 2 except that 40 g of γ-butyrolactone was used.

Preparation Example 5; Photosensitive Paste E

A photosensitive paste E was obtained in the same manner as in Preparation Example 1 except that Ag particles having an average particle diameter of 0.7 μm were used.

Preparation Example 6; Photosensitive Paste F

A photosensitive paste F was obtained in the same manner as in Preparation Example 5 except that 20 g of the compound P4 was used but the compound P3 was not used.

Preparation Example 7

A photosensitive paste G was obtained in the same manner as in Preparation Example 1 except that Ag particles having an average particle diameter of 0.5 μm were used.

Preparation Example 8

A photosensitive paste H was obtained in the same manner as in Preparation Example 7 except that 20 g of the compound P2 was used but the compound P3 was not used.

(Production of Semiconductor Solution)

In the production of a semiconductor solution, first, 1.0 mg of CNT (single-walled CNTs manufactured by CNI, purity: 95%) was added to a solution containing 2.0 mg of P3HT (poly(3-hexylthiophene) manufactured by Aldrich) in chloroform (10 ml), and the mixture was ultrasonically stirred at an output of 20% for 4 hours using an ultrasonic homogenizer (VCX-500 manufactured by TOKYO RIKAK-IKAI CO., LTD.) while being ice-cooled. This yielded a CNT dispersion A11 (having a CNT composite concentration relative to the solvent of 0.96 g/l).

Next, the CNT dispersion A11 was filtered using a membrane filter (pore diameter: 10 μm, diameter: 25 mm, Omnipore membrane manufactured by Millipore) to remove a CNT composite having a length of 10 μm or more. To the filtrate thus obtained was added 5 ml of o-DCB (manufactured by Wako Pure Chemical Industries, Ltd.), followed by distillation of chloroform that was a low boiling point solvent using a rotary evaporator, whereby the solvent was substituted with o-DCB to yield a CNT dispersion B11. To the CNT dispersion B11 (1 ml) was added 3 ml of o-DCB to yield a semiconductor solution A1 (having a CNT composite concentration with respect to the solvent of 0.03 g/l).

Composition Preparation Example 1

In Composition Preparation Example 1, a gate insulating layer solution A2 was prepared. Specifically, first, methyltrimethoxysilane (61.29 g (0.45 mol)), 2-(3,4-epoxycyclohexyl)ethyltrimethoxysilane (12.31 g (0.05 mol)) and phenyltrimethoxysilane (99.15 g (0.5 mol)) were dissolved in 203.36 g of propylene glycol monobutyl ether (boiling point: 170° C.). To this were added water (54.90 g) and phosphoric acid (0.864 g) with stirring. The solution thus obtained was heated at a bath temperature of 105° C. for 2 hours to raise the internal temperature to 90° C. to distill off a component mainly composed of methanol as a by-product. Then, the mixture was heated at a bath temperature of 130° C. for 2 hours to raise the internal temperature to 118° C. to distill off a component mainly composed of water and propylene glycol monobutyl ether. Thereafter, the mixture was cooled to room temperature to yield a polysiloxane solution A3 having a solid content concentration of 26.0 wt %. The weight average molecular weight of polysiloxane in the obtained polysiloxane solution A3 was 6000.

Next, 10 g of the obtained polysiloxane solution A3 was weighed. With this was mixed 54.4 g of propylene glycol monoethyl ether acetate (hereinafter, referred to as PGMEA), followed by stirring at room temperature for 2 hours. In this way, a gate insulating layer solution A2 was obtained.

Example 1

In Example 1, the FET according to an embodiment of the present invention (see FIG. 2) was produced. Specifically, first, chromium and gold were vacuum-deposited to thicknesses of 5 nm and 50 nm, respectively on a substrate 1 (film thickness: 50 μm) made of a PET film through a mask by a resistance heating method, thereby forming a gate electrode 2 of an FET. Next, the insulating layer solution A2 was applied onto the substrate 1 by a spin coating method (1000 rpm×20 seconds), followed by heat treatment at 120° C. for 3 minutes in the atmosphere, and heat treatment at 150° C. for 120 minutes in a nitrogen atmosphere, thereby forming a gate insulating layer 3 having a film thickness of 500 nm.

On the substrate on which the gate insulating layer had been formed as described above, 100 pl of the semiconductor solution A1 was applied by an inkjet method onto the gate insulating layer located on the projection with respect to the gate electrode, followed by heat treatment at 150° C. for 30 minutes under a nitrogen stream on a hot plate to form a semiconductor layer 4.

Next, the photosensitive paste A was applied onto the substrate made of a PET film by screen printing, and prebaked in a drying oven at 100° C. for 10 minutes. Thereafter, using an exposure device "PEM-8M" (trade name, manufactured by Union Optical Co., Ltd.), full line exposure (exposure performed by a mercury lamp without filter cutting a specific wavelength) was performed at an exposure amount of 100 mJ/cm$^2$ (in terms of a wavelength of 365 nm) from the back surface side through a photomask having frames of the source electrode and the drain electrode designed, and further full line exposure was performed at an exposure amount of 70 mJ/cm$^2$ (in terms of a wavelength of 365 nm) from the front surface side through a photomask having the wires designed. After the exposure, immersion development was performed with a 0.5% $Na_2CO_3$ solution for 30 seconds, followed by rinsing with ultrapure water, and then curing in a drying oven at 140° C. for 30 minutes. Thus, the source electrode 5, the drain electrode 6 and the wires 7 were formed.

The obtained FET was evaluated by the methods described in [1] to [8]. The results are shown in Table 1.

Examples 2 to 6

Using the photosensitive paste described in Table 1 in the same manner as in Example 1, each FET was evaluated in the same manner as in Example 1. The evaluation results are shown in Table 1.

Comparative Example 1

In Comparative Example 1, the same operation as in Example 1 was performed until the semiconductor layer 4 was formed. Next, the photosensitive paste A was applied onto the substrate made of a PET film by screen printing, and prebaked in a drying oven at 100° C. for 10 minutes. Thereafter, full line exposure was performed at an exposure amount of 70 mJ/cm$^2$ (in terms of a wavelength of 365 nm) from the back surface side through a photomask having frames of the source electrode, the drain electrode and the wires designed using an exposure apparatus "PEM-8M" (trade name, manufactured by Union Optical Co., Ltd.). After the exposure, immersion development was performed with a 0.5% $Na_2CO_3$ solution for 30 seconds, followed by rinsing with ultrapure water, and then curing in a drying oven at 140° C. for 30 minutes. Thus, the source electrode 5, the drain electrode 6 and the wires 7 were formed.

The obtained FET was evaluated by the methods described in [1] to [8]. The results are shown in Table 1.

Comparative Example 2

In Comparative Example 2, the same operation as in Example 1 was performed until the semiconductor layer 4 was formed. Next, the photosensitive paste A was applied onto the substrate made of a PET film by screen printing, and prebaked in a drying oven at 100° C. for 10 minutes. Thereafter, full line exposure was performed at an exposure amount of 70 mJ/cm² (in terms of a wavelength of 365 nm) from the back surface side through a photomask having frames of the source electrode and the drain electrode designed using an exposure apparatus "PEM-8M" (trade name, manufactured by Union Optical Co., Ltd.). After the exposure, immersion development was performed with a 0.5% $Na_2CO_3$ solution for 30 seconds, followed by rinsing with ultrapure water, and then curing in a drying oven at 140° C. for 30 minutes. Thus, the source electrode 5 and the drain electrode 6 were formed. Next, aluminum was vacuum-deposited to a thickness of 60 nm through a mask by a resistance heating method, thereby forming the wires 7.

In the obtained FET, no continuous phase was formed between the source electrode 5 and the wire 7, and between the drain electrode 6 and the wire 7, and peeling of the wires 7 occurred at the joint surfaces between the source electrode 5 and the wire 7, and between the drain electrode 6 and the wire 7 during handling, so that evaluation by the methods described in [1] to [8] could not be performed.

heat treatment at 150° C. for 120 minutes in a nitrogen atmosphere, thereby forming a gate insulating layer 3 having a film thickness of 500 nm.

On the substrate on which the gate insulating layer had been formed as described above, 100 pl of the semiconductor solution A1 was applied by an inkjet method onto the gate insulating layer located on the projection with respect to the gate electrode, followed by heat treatment at 150° C. for 30 minutes under a nitrogen stream on a hot plate to form a semiconductor layer 4.

Next, the photosensitive paste A was applied onto the substrate made of a PET film by screen printing, and prebaked in a drying oven at 100° C. for 10 minutes. Thereafter, using an exposure device "PEM-8M" (trade name, manufactured by Union Optical Co., Ltd.), full line exposure was performed at an exposure amount of 20 mJ/cm² (in terms of a wavelength of 365 nm) from the back surface side through a photomask having frames of the source electrode and the drain electrode designed, and further full line exposure was performed at an exposure

TABLE 1-1

| | Configuration | Source/drain electrode | Distance between source electrode and drain electrode | Reflectance ratio (Source-drain electrode/wire) | Presence or absence of joint surface | Edge detection | Average value of misalignment (X) | Mobility [cm²/V·sec] |
|---|---|---|---|---|---|---|---|---|
| Example 1 | Fig. 2 | Photosensitive paste A | 20 μm | 0.92 | Absence | B | 0.5 μm | 0.6 |
| Example 2 | Fig. 2 | Photosensitive paste B | 20 μm | 0.88 | Absence | B | 0.2 μm | 0.5 |
| Example 3 | Fig. 2 | Photosensitive paste C | 20 μm | 0.92 | Absence | B | 0.2 μm | 0.6 |
| Example 4 | Fig. 2 | Photosensitive paste D | 20 μm | 0.88 | Absence | B | 0.5 μm | 0.7 |
| Example 5 | Fig. 2 | Photosensitive paste E | 20 μm | 0.89 | Absence | B | 0.4 μm | 0.6 |
| Example 6 | Fig. 2 | Photosensitive paste F | 20 μm | 0.90 | Absence | B | 0.4 μm | 0.8 |
| Comparative Example 1 | Fig. 2 | Photosensitive paste A | 20 μm | 1.00 | Absence | C | 0.1 μm | 0.7 |

TABLE 1-2

| | Configuration | Surface roughness of source/drain electrode | Surface roughness of wire | Film thickness of source/drain electrode | Film thickness of wire | Ratio of silver in elemental composition of source/drain electrode | Ratio of silver in elemental composition of wire |
|---|---|---|---|---|---|---|---|
| Example 1 | Fig. 2 | 40 nm | 36 nm | 15.0 μm | 15.3 μm | 2% | 2% |
| Example 2 | Fig. 2 | 23 nm | 22 nm | 5.5 μm | 5.8 μm | 2% | 3% |
| Example 3 | Fig. 2 | 40 nm | 28 nm | 3.8 μm | 4.0 μm | 7% | 9% |
| Example 4 | Fig. 2 | 34 nm | 23 nm | 6.3 μm | 6.5 μm | 5% | 3% |
| Example 5 | Fig. 2 | 53 nm | 47 nm | 2.8 μm | 2.8 μm | 5% | 3% |
| Example 6 | Fig. 2 | 72 nm | 56 nm | 2.2 μm | 2.3 μm | 3% | 2% |
| Comparative Example 1 | Fig. 2 | 80 nm | 75 nm | 4.4 μm | 4.4 μm | 2% | 2% |

Example 7

In Example 7, the FET according to an embodiment of the present invention (see FIG. 2) was produced. Specifically, first, copper was vacuum-deposited to thicknesses of 100 nm on a substrate 1 (film thickness: 50 μm) made of a PET film through a mask by a resistance heating method, thereby forming a gate electrode 2 of an FET. Next, the insulating layer solution A2 was applied onto the substrate 1 by a spin coating method (1000 rpm×20 seconds), followed by heat treatment at 120° C. for 3 minutes in the atmosphere, and amount of 70 mJ/cm² (in terms of a wavelength of 365 nm) from the front surface side through a photomask having the wires designed. After the exposure, immersion development was performed with a 0.5% $Na_2CO_3$ solution for 30 seconds, followed by rinsing with ultrapure water, and then curing in a drying oven at 140° C. for 30 minutes. Thus, the source electrode 5, the drain electrode 6 and the wires 7 were formed.

The obtained FET was evaluated by the methods described in [1] to [8]. The results are shown in Table 2.

Examples 8 to 12

Using the photosensitive paste described in Table 2 in the same manner as in Example 7, each FET was evaluated in the same manner as in Example 2. The evaluation results are shown in Table 2.

Comparative Example 3

In Comparative Example 3, the same operation as in Example 1 was performed until the semiconductor layer 4 was formed. Next, the photosensitive paste A was applied onto the substrate made of a PET film by screen printing, and prebaked in a drying oven at 100° C. for 10 minutes. Thereafter, full line exposure was performed at an exposure amount of 70 mJ/cm$^2$ (in terms of a wavelength of 365 nm) from the front surface side through a photomask having frames of the source electrode, the drain electrode and the wires designed using an exposure apparatus "PEM-8M" (trade name, manufactured by Union Optical Co., Ltd.). After the exposure, immersion development was performed with a 0.5% Na$_2$CO$_3$ solution for 30 seconds, followed by rinsing with ultrapure water, and then curing in a drying oven at 140° C. for 30 minutes. Thus, the source electrode 5, the drain electrode 6 and the wires 7 were formed.

The obtained FET was evaluated by the methods described in [1] to [8]. The results are shown in Table 2.

100 nm on a substrate 1 (film thickness: 50 μm) made of a PET film through a mask by a resistance heating method, thereby forming a gate electrode 2 of an FET. Next, the insulating layer solution A2 was applied onto the substrate 1 by a spin coating method (1000 rpm×20 seconds), followed by heat treatment at 120° C. for 3 minutes in the atmosphere, and heat treatment at 150° C. for 120 minutes in a nitrogen atmosphere, thereby forming a gate insulating layer 3 having a film thickness of 500 nm.

Next, the photosensitive paste A was applied onto the substrate made of a PET film by screen printing, and prebaked in a drying oven at 100° C. for 10 minutes. Thereafter, using an exposure device "PEM-8M" (trade name, manufactured by Union Optical Co., Ltd.), full line exposure was performed at an exposure amount of 10 mJ/cm$^2$ (in terms of a wavelength of 365 nm) from the back surface side through a photomask having frames of the source electrode and the drain electrode designed, and further full line exposure was performed at an exposure amount of 70 mJ/cm$^2$ (in terms of a wavelength of 365 nm) from the front surface side through a photomask having the wires designed. After the exposure, immersion development was performed with a 0.5% Na$_2$CO$_3$ solution for 30 seconds, followed by rinsing with ultrapure water, and then curing in a drying oven at 140° C. for 30 minutes. Thus, the source electrode 5, the drain electrode 6 and the wires 7 were formed.

TABLE 2-1

| | Configuration | Source/drain electrode | Distance between source electrode and drain electrode | Reflectance ratio (Source-drain electrode/wire) | Presence or absence of joint surface | Edge detection | Average value of misalignment (X) | Mobility [cm$^2$/V·sec] |
|---|---|---|---|---|---|---|---|---|
| Example 7 | Fig. 2 | Photosensitive paste A | 20 μm | 0.90 | Absence | A | 0.3 μm | 0.7 |
| Example 8 | Fig. 2 | Photosensitive paste B | 20 μm | 0.85 | Absence | A | 0.4 μm | 0.6 |
| Example 9 | Fig. 2 | Photosensitive paste C | 20 μm | 0.85 | Absence | A | 0.4 μm | 0.6 |
| Example 10 | Fig. 2 | Photosensitive paste D | 20 μm | 0.77 | Absence | A | 0.2 μm | 0.6 |
| Example 11 | Fig. 2 | Photosensitive paste E | 20 μm | 0.86 | Absence | A | 0.4 μm | 0.5 |
| Example 12 | Fig. 2 | Photosensitive paste F | 20 μm | 0.85 | Absence | A | 0.2 μm | 0.8 |
| Comparative Example 3 | Fig. 2 | Photosensitive paste A | 20 μm | 1.00 | Absence | C | 5.2 μm | 0.05 |

TABLE 2-2

| | Configuration | Surface roughness of source/drain electrode | Surface roughness of wire | Film thickness of source/drain electrode | Film thickness of wire | Ratio of silver in elemental composition of source/drain electrode | Ratio of silver in elemental composition of wire |
|---|---|---|---|---|---|---|---|
| Example 7 | Fig. 2 | 78 nm | 31 nm | 7.2 μm | 14.2 μm | 8% | 1% |
| Example 8 | Fig. 2 | 123 nm | 20 nm | 1.7 μm | 6.0 μm | 9% | 2% |
| Example 9 | Fig. 2 | 130 nm | 32 nm | 1.6 μm | 4.2 μm | 15% | 9% |
| Example 10 | Fig. 2 | 147 nm | 17 nm | 1.6 μm | 5.4 μm | 17% | 3% |
| Example 11 | Fig. 2 | 152 nm | 42 nm | 1.8 μm | 2.5 μm | 7% | 1% |
| Example 12 | Fig. 2 | 127 nm | 35 nm | 1.5 μm | 2.0 μm | 5% | 1% |
| Comparative Example 3 | Fig. 2 | 32 nm | 35 nm | 14.3 μm | 14.4 μm | 1% | 1% |

Example 13

In Example 13, the FET according to an embodiment of the present invention (see FIG. 1) was produced. Specifically, first, copper was vacuum-deposited to thicknesses of Next, 100 pl of the semiconductor solution A1 was applied between the source electrode and the drain electrode by an inkjet method, followed by heat treatment at 150° C. for 30 minutes under a nitrogen stream on a hot plate to form a semiconductor layer 4.

The obtained FET was evaluated by the methods described in [1] to [8]. The results are shown in Table 3.

Examples 14 to 18

Using the photosensitive paste described in Table 3 in the same manner as in Example 13, each FET was evaluated in the same manner as in Example 13. The evaluation results are shown in Table 3.

TABLE 3-1

| | Configuration | Source/drain electrode | Distance between source electrode and drain electrode | Reflectance ratio (Source-drain electrode/wire) | Presence or absence of joint surface | Edge detection | Average value of misalignment (X) | Mobility [cm$^2$/V·sec] |
|---|---|---|---|---|---|---|---|---|
| Example 13 | Fig. 1 | Photosensitive paste A | 20 μm | 0.85 | Absence | A | 0.5 μm | 0.6 |
| Example 14 | Fig. 1 | Photosensitive paste B | 20 μm | 0.83 | Absence | A | 0.3 μm | 0.6 |
| Example 15 | Fig. 1 | Photosensitive paste C | 20 μm | 0.80 | Absence | A | 0.5 μm | 0.7 |
| Example 16 | Fig. 1 | Photosensitive paste D | 20 μm | 0.82 | Absence | A | 0.4 μm | 0.5 |
| Example 17 | Fig. 1 | Photosensitive paste E | 20 μm | 0.86 | Absence | A | 0.5 μm | 0.5 |
| Example 18 | Fig. 1 | Photosensitive paste F | 20 μm | 0.85 | Absence | A | 0.3 μm | 0.7 |

TABLE 3-2

| | Configuration | Surface roughness of source/drain electrode | Surface roughness of wire | Film thickness of source/drain electrode | Film thickness of wire | Ratio of silver in elemental composition of source/drain electrode | Ratio of silver in elemental composition of wire |
|---|---|---|---|---|---|---|---|
| Example 13 | Fig. 1 | 94 nm | 30 nm | 6.4 μm | 13.5 μm | 12% | 1% |
| Example 14 | Fig. 1 | 164 nm | 25 nm | 1.2 μm | 6.3 μm | 10% | 2% |
| Example 15 | Fig. 1 | 159 nm | 42 nm | 1.1 μm | 4.5 μm | 18% | 8% |
| Example 16 | Fig. 1 | 183 nm | 23 nm | 1.1 μm | 5.2 μm | 20% | 3% |
| Example 17 | Fig. 1 | 163 nm | 38 nm | 1.7 μm | 2.8 μm | 8% | 1% |
| Example 18 | Fig. 1 | 137 nm | 46 nm | 1.5 μm | 2.3 μm | 6% | 1% |

Example 19

In Example 19, the FET according to an embodiment of the present invention (see FIG. 2) was produced. Specifically, first, chromium and gold were vacuum-deposited to thicknesses of 5 nm and 50 nm, respectively on a substrate 1 (film thickness: 50 μm) made of a PET film through a mask by a resistance heating method, thereby forming a gate electrode 2 of an FET. Next, the insulating layer solution A2 was applied onto the substrate 1 by a spin coating method (1000 rpm×20 seconds), followed by heat treatment at 120° C. for 3 minutes in the atmosphere, and heat treatment at 150° C. for 120 minutes in a nitrogen atmosphere, thereby forming a gate insulating layer 3 having a film thickness of 500 nm.

On the substrate on which the gate insulating layer had been formed as described above, 100 pl of the semiconductor solution A1 was applied by an inkjet method onto the gate insulating layer located on the projection with respect to the gate electrode, followed by heat treatment at 150° C. for 30 minutes under a nitrogen stream on a hot plate to form a semiconductor layer 4.

Next, the photosensitive paste G was applied onto the substrate made of a PET film by screen printing, and prebaked in a drying oven at 100° C. for 10 minutes. Thereafter, using an exposure device "PEM-8M" (trade name, manufactured by Union Optical Co., Ltd.), full line exposure was performed at an exposure amount of 10 mJ/cm$^2$ (in terms of a wavelength of 365 nm) from the back surface side through a photomask having frames of the source electrode and the drain electrode designed, and further full line exposure was performed at an exposure amount of 70 mJ/cm$^2$ (in terms of a wavelength of 365 nm) from the front surface side through a photomask having the wires designed. After the exposure, immersion development was performed with a 0.5% Na$_2$CO$_3$ solution for 30 seconds, followed by rinsing with ultrapure water, and then curing in a drying oven at 140° C. for 30 minutes. Thus, the source electrode 5, the drain electrode 6 and the wires 7 were formed.

The obtained FET was evaluated by the methods described in [1] to [3] and [6] to [9]. The results are shown in Table 4.

Example 20

Using the photosensitive paste H in the same manner as in Example 19, each FET was evaluated in the same manner as in Example 19. The evaluation results are shown in Table 4.

Example 21

In Example 21, the same operation as in Example 19 was performed until the photosensitive paste H was applied onto the substrate made of a PET film by screen printing, and prebaked in a drying oven at 100° C. for 10 minutes. Thereafter, using an exposure device "PEM-8M" (trade name, manufactured by Union Optical Co., Ltd.), full line exposure was performed at an exposure amount of 70 mJ/cm$^2$ (in terms of a wavelength of 365 nm) from the back surface side through a photomask having frames of the source electrode and the drain electrode designed, and further full line exposure was performed at an exposure amount of 70 mJ/cm² (in terms of a wavelength of 365 nm) from the front surface side through a photomask having the wires designed. After the exposure, immersion development was performed with a 0.5% Na₂CO₃ solution for 30 seconds, followed by rinsing with ultrapure water, and then curing in a drying oven at 140° C. for 30 minutes. Thus, the source electrode 5, the drain electrode 6 and the wires 7 were formed.

The obtained FET was evaluated in the same manner as in Example 19. The evaluation results are shown in Table 4.

Example 22

In Example 22, the same operation as in Example 19 was performed until the photosensitive paste H was applied onto the substrate made of a PET film by screen printing, and prebaked in a drying oven at 100° C. for 10 minutes. Thereafter, using an exposure device "PEM-8M" (trade name, manufactured by Union Optical Co., Ltd.), full line exposure was performed at an exposure amount of 100 mJ/cm² (in terms of a wavelength of 365 nm) from the back surface side through a photomask having frames of the source electrode and the drain electrode designed, and further full line exposure was performed at an exposure amount of 70 mJ/cm² (in terms of a wavelength of 365 nm) from the front surface side through a photomask having the wires designed. After the exposure, immersion development was performed with a 0.5% Na₂CO₃ solution for 30 seconds, followed by rinsing with ultrapure water, and then curing in a drying oven at 140° C. for 30 minutes. Thus, the source electrode 5, the drain electrode 6 and the wires 7 were formed.

The obtained FET was evaluated in the same manner as in Example 19. The evaluation results are shown in Table 4.

Comparative Example 4

In Comparative Example 4, the same operation as in Example 19 was performed until the semiconductor layer 4 was formed. Next, the photosensitive paste H was applied onto the substrate made of a PET film by screen printing, and prebaked in a drying oven at 100° C. for 10 minutes. Thereafter, full line exposure was performed at an exposure amount of 70 mJ/cm² (in terms of a wavelength of 365 nm) from the front surface side through a photomask having frames of the source electrode, the drain electrode and the wires designed using an exposure apparatus "PEM-8M" (trade name, manufactured by Union Optical Co., Ltd.). After the exposure, immersion development was performed with a 0.5% Na₂CO₃ solution for 30 seconds, followed by rinsing with ultrapure water, and then curing in a drying oven at 140° C. for 30 minutes. Thus, the source electrode 5, the drain electrode 6 and the wires 7 were formed.

The obtained FET was evaluated in the same manner as in Example 19. The evaluation results are shown in Table 4.

TABLE 4-1

| | Configuration | Source/drain electrode | Distance between source electrode and drain electrode | Reflectance ratio (Source-drain electrode/wire) | Presence or absence of joint surface | Luminance detection | Surface roughness of source/drain electrode |
|---|---|---|---|---|---|---|---|
| Example 19 | Fig. 2 | Photosensitive paste G | 20 μm | 0.81 | Absence | A | 184 nm |
| Example 20 | Fig. 2 | Photosensitive paste H | 20 μm | 0.85 | Absence | A | 212 nm |
| Example 21 | Fig. 2 | Photosensitive paste H | 20 μm | 0.85 | Absence | A | 25 nm |
| Example 22 | Fig. 2 | Photosensitive paste H | 20 μm | 0.93 | Absence | B | 22 nm |
| Comparative Example 4 | Fig. 2 | Photosensitive paste H | 20 μm | 1.00 | Absence | C | 20 nm |

TABLE 4-2

| | Configuration | Surface roughness of wire | Film thickness of source/drain electrode | Film thickness of wire | Ratio of silver in elemental composition of source/drain electrode | Ratio of silver in elemental composition of wire |
|---|---|---|---|---|---|---|
| Example 19 | Fig. 2 | 42 nm | 1.6 μm | 2.3 μm | 12% | 1% |
| Example 20 | Fig. 2 | 20 nm | 1.8 μm | 2.4 μm | 7% | 1% |
| Example 21 | Fig. 2 | 25 nm | 2.3 μm | 2.3 μm | 5% | 1% |
| Example 22 | Fig. 2 | 25 nm | 2.5 μm | 2.5 μm | 2% | 1% |
| Comparative Example 4 | Fig. 2 | 23 nm | 2.5 μm | 2.5 μm | 1% | 1% |

DESCRIPTION OF REFERENCE SIGNS

1: Substrate
2: Gate electrode
3: Gate insulating layer
4: Semiconductor layer
5: Source electrode
6: Drain electrode
7: Wire for source/drain electrode
8: Electrically conductive film
10: FET
11: Photomask
12: Photomask
100: Substrate
101: Antenna pattern
102: Circuit
103: Connection wire
20: FET

The invention claimed is:

1. A field-effect transistor comprising, on a substrate, a source electrode, a drain electrode, and a gate electrode; a semiconductor layer in contact with the source electrode and the drain electrode; wires individually electrically connected to the source electrode and the drain electrode; and a gate insulating layer that insulates the semiconductor layer from the gate electrode; wherein a connecting portion between the source electrode and the wire forms a continuous phase, and a connecting portion between the drain electrode and the wire forms a continuous phase, the portions constituting the continuous phases contain at least an electrically conductive component and an organic component, and integrated values of optical reflectance at a region of a wavelength of 600 nm or more and 900 nm or less on the wires are higher than integrated values of optical reflectance at a region of a wavelength of 600 nm or more and 900 nm or less on the source electrode and the drain electrode.

2. The field-effect transistor according to claim 1, wherein average thicknesses of the source electrode and the drain electrode are 10% or more thinner than average thicknesses of the wires.

3. The field-effect transistor according to claim 1, wherein arithmetic surface roughnesses of the source electrode and the drain electrode are larger than an arithmetic surface roughnesses of the wires.

4. The field-effect transistor according to claim 1, wherein the integrated values of optical reflectance at a region of a wavelength of 600 nm or more and 900 nm or less on the wires are 5% or more higher than the integrated values of optical reflectance at a region of a wavelength of 600 nm or more and 900 nm or less on the source electrode and the drain electrode.

5. The field-effect transistor according to claim 1, wherein the gate electrode has a thickness of 30 nm or more and 500 nm or less.

6. The field-effect transistor according to claim 1, wherein thicknesses of the source electrode and the drain electrode are within a range of 5 times or more and 50 times or less of a thickness of the gate electrode.

7. The field-effect transistor according to claim 1, wherein the semiconductor layer contains carbon nanotubes.

8. The field-effect transistor according to claim 1, wherein the semiconductor layer contains a carbon nanotube composite to at least a part of a surface of which a conjugated polymer is attached.

9. The field-effect transistor according to claim 1, wherein elemental composition ratios of the electrically conductive component in the source electrode and the drain electrode on a surface of a portion constituting the continuous phase are 25% or less, and elemental composition ratios of the electrically conductive component in the source electrode and the drain electrode on a surface of a portion constituting the continuous phase are higher than elemental composition ratios of the electrically conductive component in the wires on a surface of a portion constituting the continuous phase.

10. A method for manufacturing the field-effect transistor according to claim 1, comprising the steps of:
forming a gate electrode on a surface of a substrate;
forming a gate insulating layer on the gate electrode;
forming a semiconductor layer on the gate insulating layer by a coating method;
forming an electrically conductive film containing electrically conductive particles and a photosensitive organic component onto the gate insulating layer by a coating method;
exposing the electrically conductive film to patterns of a source electrode and a drain electrode using a photomask and the gate electrode as a mask from a back surface side of the substrate;
exposing the electrically conductive film to patterns of wires using a photomask from a front surface side of the substrate; and
developing the exposed electrically conductive film to form the source electrode, the drain electrode and the wires.

11. The method for manufacturing a field-effect transistor according to claim 10, wherein an exposure amount in the exposing step from a back surface side is half or less of an exposure amount in the exposing step from a front surface side.

12. A wireless communication device comprising at least the field-effect transistor at least according to claim 1 and an antenna.

* * * * *